US011988629B2

(12) United States Patent
Lim et al.

(10) Patent No.: US 11,988,629 B2
(45) Date of Patent: May 21, 2024

(54) METHOD OF MANUFACTURING A GRAPHENE-BASED BIOLOGICAL FIELD-EFFECT TRANSISTOR

(71) Applicant: Lyten, Inc., San Jose, CA (US)

(72) Inventors: Sung H. Lim, Mountain View, CA (US); Eric Lewis Danielson, Santa Clara, CA (US); Maurizio Tarsia, San Carlos, CA (US); Gary Robert Larsen, San Jose, CA (US)

(73) Assignee: Lyten, Inc., San Jose, CA (US)

( * ) Notice: Subject to any disclaimer, the term of this patent is extended or adjusted under 35 U.S.C. 154(b) by 476 days.

(21) Appl. No.: 17/382,661

(22) Filed: Jul. 22, 2021

(65) Prior Publication Data

US 2021/0396709 A1 Dec. 23, 2021

Related U.S. Application Data

(63) Continuation-in-part of application No. 17/354,175, filed on Jun. 22, 2021, now abandoned.
(Continued)

(51) Int. Cl.
*H01L 29/16* (2006.01)
*G01N 27/414* (2006.01)
*H01L 29/66* (2006.01)

(52) U.S. Cl.
CPC ..... *G01N 27/4145* (2013.01); *H01L 29/1606* (2013.01); *H01L 29/66045* (2013.01)

(58) Field of Classification Search
None
See application file for complete search history.

(56) References Cited

U.S. PATENT DOCUMENTS 8,281,642 B2 10/2012 Lee et al.
8,364,419 B2 1/2013 Potyrailo et al.
(Continued)

FOREIGN PATENT DOCUMENTS

WO 2016/068810 A1 5/2016
WO 2022/056645 A1 3/2022

OTHER PUBLICATIONS

Na, K., et al., "Graphene-Based Wireless Environmental Gas Sensor on PET Substrate", IEEE Sensor Journal, Feb. 18, 2016, pp. 5003-5009.
(Continued)

*Primary Examiner* — Michelle Mandala
(74) *Attorney, Agent, or Firm* — Paradice & Li LLP

(57) ABSTRACT

A method for manufacturing a biological field-effect transistor (BioFET) is disclosed. In some implementations, the method may include preparing a carbonaceous dispersion by adding a three-dimensional (3D) graphene into a solvent; depositing the carbonaceous dispersion onto a p-type silicon wafer; spin-coating a positive photoresist over the carbonaceous dispersion; forming source and drain terminals on the p-type silicon wafer, the source and drain terminals in contact with the 3D graphene of the carbonaceous dispersion; removing residual photoresist from the carbonaceous dispersion by placing the p-type silicon wafer in 1-methyl-2-pyrrolidone (NMP); and biofunctionalizing the carbonaceous dispersion with a molecular recognition element configured to alter one or more electrical properties of the Bio-FET in response to exposure of the molecular recognition element to the analyte.

22 Claims, 30 Drawing Sheets

Related U.S. Application Data

(60) Provisional application No. 63/042,808, filed on Jun. 23, 2020.

(56) References Cited

U.S. PATENT DOCUMENTS

| | | | |
|---|---|---|---|
| 8,567,232 B2 | 10/2013 | Ackley et al. | |
| 8,736,425 B2 | 5/2014 | Potyrailo et al. | |
| 8,754,454 B2 | 6/2014 | Bryant et al. | |
| 8,821,745 B2 | 9/2014 | Luo et al. | |
| 8,951,473 B2 | 2/2015 | Wang et al. | |
| 9,395,343 B2 | 7/2016 | Schmid et al. | |
| 9,678,036 B2 | 6/2017 | Balandin | |
| 9,735,279 B2 | 8/2017 | Sato et al. | |
| 9,869,651 B2 | 1/2018 | Akinwande et al. | |
| 10,024,831 B2 | 7/2018 | Ruhl et al. | |
| 10,031,097 B1 | 7/2018 | Han et al. | |
| 10,502,705 B2 | 12/2019 | Stowell et al. | |
| 10,802,018 B2 | 10/2020 | Cubukcu et al. | |
| 2006/0246478 A1* | 11/2006 | Yoo | G01N 33/54306 435/7.1 |
| 2007/0048181 A1 | 3/2007 | Chang et al. | |
| 2008/0135614 A1 | 6/2008 | Werner et al. | |
| 2012/0006102 A1 | 1/2012 | Bryant et al. | |
| 2014/0260547 A1 | 9/2014 | Balandin | |
| 2014/0305191 A1 | 10/2014 | Schmid et al. | |
| 2015/0008486 A1 | 1/2015 | Bryant et al. | |
| 2015/0323482 A1 | 11/2015 | Shimoyama et al. | |
| 2015/0377824 A1 | 12/2015 | Ruhl et al. | |
| 2016/0091447 A1 | 3/2016 | Yu et al. | |
| 2016/0116430 A1 | 4/2016 | Nauber et al. | |
| 2016/0123947 A1 | 5/2016 | Briman et al. | |
| 2016/0169824 A1 | 6/2016 | Shin et al. | |
| 2016/0177387 A1 | 6/2016 | Roy et al. | |
| 2016/0195488 A1 | 7/2016 | Ensor et al. | |
| 2016/0282312 A1 | 9/2016 | Cable et al. | |
| 2016/0290956 A1 | 10/2016 | Sato et al. | |
| 2016/0377611 A1 | 12/2016 | Ma et al. | |
| 2017/0181669 A1 | 6/2017 | Lin et al. | |
| 2017/0315075 A1 | 11/2017 | Akinwande et al. | |
| 2017/0322094 A1 | 11/2017 | Kim et al. | |
| 2017/0350882 A1 | 12/2017 | Lin et al. | |
| 2017/0356869 A1 | 12/2017 | Koenig et al. | |
| 2018/0136157 A1 | 5/2018 | Harada et al. | |
| 2019/0033252 A1* | 1/2019 | Huang | H10N 30/2047 |
| 2019/0187090 A1 | 6/2019 | Grabbert et al. | |
| 2019/0312171 A1 | 10/2019 | Karabiyik et al. | |
| 2020/0080977 A1 | 3/2020 | Isobayashi et al. | |

OTHER PUBLICATIONS

Skryshevsky et al., "Impedance spectroscopy of single graphene layer at gas adsorption," Phys. Status Solidi A, vol. 212, No. 9, pp. 1941-1945 (Apr. 2015).

Wang et al., "A Review on Graphene-Based Gas/Vapor Sensors with Unique Properties and Potential Applications," Nano-Micro Lett. Jul. 2015, 8(2): pp. 95-119.

Zhu, A. et al., "Optoelectromechanical Multimodal Biosensor with Graphene Active Region", NanoLetters; vol. 14; Sep. 3, 2014; pp. 5641-5649.

Chang, J. et al., "Real-time detection of mercury ions in water using a reduced graphene oxide/DNA field-effect transistor with assistance of a passivation layer", Sensing and Bio-Sensing Research; vol. 5; Sep. 1, 2015; pp. 97-104.

Esfandiar, A. et al., "DNA-decorated graphene nanomesh for detection of chemical vapors", Appl. Phys. Lett.; Oct. 31, 2013; vol. 103, No. 183110; 6 pages.

International Search Report and Written Opinion dated Nov. 8, 2022 for PCT Appl. No. PCT/US2022/037614; 17 pages.

Kumar, N. et al., "Detection of a multi-disease biomarker in saliva with graphene field effect transistors", retrieved from the internet: https://www.biorxiv.org/content/10.1101/2020.05.22.111047v1.full.pdf (retrived on Apr. 29, 2022); Dept. of Physics, Boston College; May 23, 2020; 23 pages.

Xiang, L. et al., "Inkjet-Printed Flexible Biosensor Based on Graphene Field Effect Transistor", IEEE Sensors Journal, vol. 16, No. 23; Dec. 1, 2016; pp. 8359-8364.

* cited by examiner

500A

500B

600A

600B

1600E → 1602E

> Determine one or more of a presence, an absence, or concentration of the target analyte based on changes in the electric current.

> Detect a change in the electric current at a particular bias voltage applied by the immersed gate electrode.

> Define a region of operation for the biosensor based on the target analyte.

> Detect the presence of the target analyte in a liquid environment having an ionic salt concentration exceeding 100 millimolar (mM).

> Block fluid communication between the external environment and each of a source region and a drain region of the BioFET.

Deposit thermal oxide onto the p-type silicon wafer.

Coat the p-type silicon wafer with the carbonaceous dispersion.

Apply a piranha solution including a 3:1 mixture of sulfuric acid ($H_2SO_4$) and hydrogen peroxide ($H_2O_2$) to remove any organic residue on exposed surfaces of one or more of the carbonaceous dispersion or the p-type silicon wafer.

1702U
Stack biomolecules on exposed surfaces of the 3D graphene.

1702V
Yield carboxylic acids on exposed surfaces of the carbonaceous dispersion.

1704V
React carboxylic acids with amines from bioreceptors in the carbonaceous dispersion using EDC (1-ethyl-3-(3-dimethylaminopropyl)carbodiimide hydrochloride) and sulfo-NHS (*N*-hydroxysulfosuccinimide).

*Figure 17V*

METHOD OF MANUFACTURING A GRAPHENE-BASED BIOLOGICAL FIELD-EFFECT TRANSISTOR

CROSS-REFERENCE TO RELATED APPLICATIONS

This patent application is a continuation-in-part application and claims priority to U.S. patent application Ser. No. 17/354,175 entitled "BIOFUNCTIONALIZED HIGH-FREQUENCY THREE DIMENSIONAL GRAPHENE FIELD EFFECT TRANSISTOR" filed on Jun. 22, 2021, which claims priority to U.S. Provisional Patent Application No. 63/042,808 entitled "EMBEDDED BIOSENSORS" filed on Jun. 23, 2020, all of which are assigned to the assignee hereof. The disclosures of the prior applications are considered part of and are incorporated by reference in this patent application in their respective entireties.

TECHNICAL FIELD

This disclosure relates generally to a sensing device for detecting harmful analytes, and more particularly to a sensing device including a biofunctionalized three-dimensional (3D) graphene layer.

DESCRIPTION OF RELATED ART

Biosensors can sense and detect biomolecules and operate on the basis of electronic, electrochemical, optical, and mechanical detection principles. Biosensors that include transistors can electrically sense charges, photons, and mechanical properties of bio-entities or biomolecules. The detection can be performed by detecting the bio-entities or biomolecules themselves, or through interaction and reaction between specified reactants and bio-entities/biomolecules. Biochips can detect particular biomolecules, measure their properties, process the signal, and may even analyze the data directly. Advanced biochips use a number of biosensors along with fluidic channels to integrate reaction, sensing and sample management.

Biological field-effect transistors (BioFETs) are a type of biosensor that includes a transistor for electrically sensing biomolecules or bio-entities. Although BioFETs are advantageous in many respects, challenges in their fabrication and/or operation arise, for example, due to compatibility issues between the semiconductor fabrication processes, the biological applications, restrictions and/or limits on the semiconductor fabrication processes, integration of the electrical signals and biological applications, and/or other challenges arising from implementing a large scale integration (LSI) process.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

One innovative aspect of the present disclosure can be implemented as a method for manufacturing a biological field-effect transistor (BioFET). In some implementations, the method may include preparing a carbonaceous dispersion by adding a three-dimensional (3D) graphene into a solvent; depositing the carbonaceous dispersion onto a p-type silicon wafer; spin-coating a positive photoresist over the carbonaceous dispersion; forming source and drain terminals on the p-type silicon wafer, the source and drain terminals in contact with the 3D graphene of the carbonaceous dispersion; removing residual photoresist from the carbonaceous dispersion by placing the p-type silicon wafer in 1-methyl-2-pyrrolidone (NMP); and biofunctionalizing the carbonaceous dispersion with a molecular recognition element configured to alter one or more electrical properties of the Bio-FET in response to exposure of the molecular recognition element to the analyte. In some aspects, preparing the carbonaceous dispersion may include sonicating the carbonaceous dispersion for a defined time period. In other aspects, preparing the carbonaceous dispersion may include discarding precipitates from the carbonaceous dispersion; and retaining the 3D graphene in the solvent.

The method may also include cleaning the p-type silicon wafer by removing organic contaminants, oxide layers, and ionic contamination. The method may also include creating a solution including deionized water, ammonium hydroxide, and hydrogen peroxide; submerging the p-type silicon wafer into the solution for a first time period; and washing the p-type silicon wafer with excess deionized water. The method may also include placing the p-type silicon wafer onto a clean alumina device inside an oxidation furnace; and performing a dry oxidation of the p-type silicon wafer using the oxidation furnace for a second time period.

The method may also include coating the p-type silicon wafer with the carbonaceous dispersion. The method may also include applying a piranha solution including a 3:1 mixture of sulfuric acid ($H_2SO_4$) and hydrogen peroxide ($H_2O_2$) to remove any organic residue on exposed surfaces of the carbonaceous dispersion or the p-type silicon wafer. In some aspects, the method may also include depositing a layer of 3-aminopropyltriethoxysilane (APTES) on the p-type silicon wafer; and creating a plurality of APTES-activated surfaces on the p-type silicon wafer by removing excess APTES with water. In other aspects, the method may also include creating a plurality of graphenated APTES-activated surfaces by spin-coating the three-dimensional graphene onto the plurality of APTES-activated surfaces; washing the plurality of graphenated APTES-activated surfaces; and annealing the plurality of graphenated APTES-activated surfaces.

The method may also include placing a photomask with an image of an array of graphene field effect transistors (FETs) over the p-type wafer; and exposing the p-type wafer to ultraviolet (UV) light. In some implementations, the method may also include immersing the p-type wafer in a developer including tetramethylammonium hydroxide; placing the p-type wafer into a plasma etcher; exposing the p-type wafer to an oxygen plasma within the plasma etcher; cleaning the p-type wafer in acetone and isopropanol; and removing the carbonaceous dispersion from the p-type wafer except in areas defined by the array of graphene field effect transistors (FETs).

In some implementations, forming the source and drain terminals may also include placing a photomask over the p-type wafer. In some instances, depositing the chromium film may also include generating a chromium vapor by heating one or more of a chromium rod or a plurality of chromium pellets in a vacuum chamber; and dispersing the chromium vapor onto the p-type wafer. In other aspects, depositing the gold film further comprises generating a gold vapor by heating one or more of a gold rod or a plurality of gold pellets in a vacuum chamber; and dispersing the gold vapor onto the chromium film. In addition, or in the alternative, the method may also include immersing the p-type wafer in acetone; and rinsing the p-type wafer with water. In some instances, the method may include disposing a shadow mask on the p-type wafer, wherein the shadow mask at least partially defines the source drain terminals.

In some instances, biofunctionalizing the carbonaceous dispersion may also include performing reductive covalent functionalization. In other instances, biofunctionalizing the carbonaceous dispersion may also include stacking biomolecules on exposed surfaces of the 3D graphene. In various implementations, performing reductive covalent functionalization may also include yielding carboxylic acids on exposed surfaces of the carbonaceous dispersion; and reacting carboxylic acids with amines from bioreceptors in the carbonaceous dispersion using EDC (1-ethyl-3-(3-dimethylaminopropyl)carbodiimide hydrochloride) and sulfo-NHS (N-hydroxysulfosuccinimide).

BRIEF DESCRIPTION OF THE DRAWINGS

Details of one or more implementations of the subject matter described in this disclosure are set forth in the accompanying drawings and the description below. Other features, aspects, and advantages will become apparent from the description, the drawings, and the claims. Note that the relative dimensions of the following figures may not be drawn to scale.

FIGS. 16A-16M show flowcharts depicting example operations for using the BioFET of FIG. 1 or the array of FIG. 2, according to some implementations.

Like reference numbers and designations in the various drawings indicate like elements.

DETAILED DESCRIPTION

Figure 1:
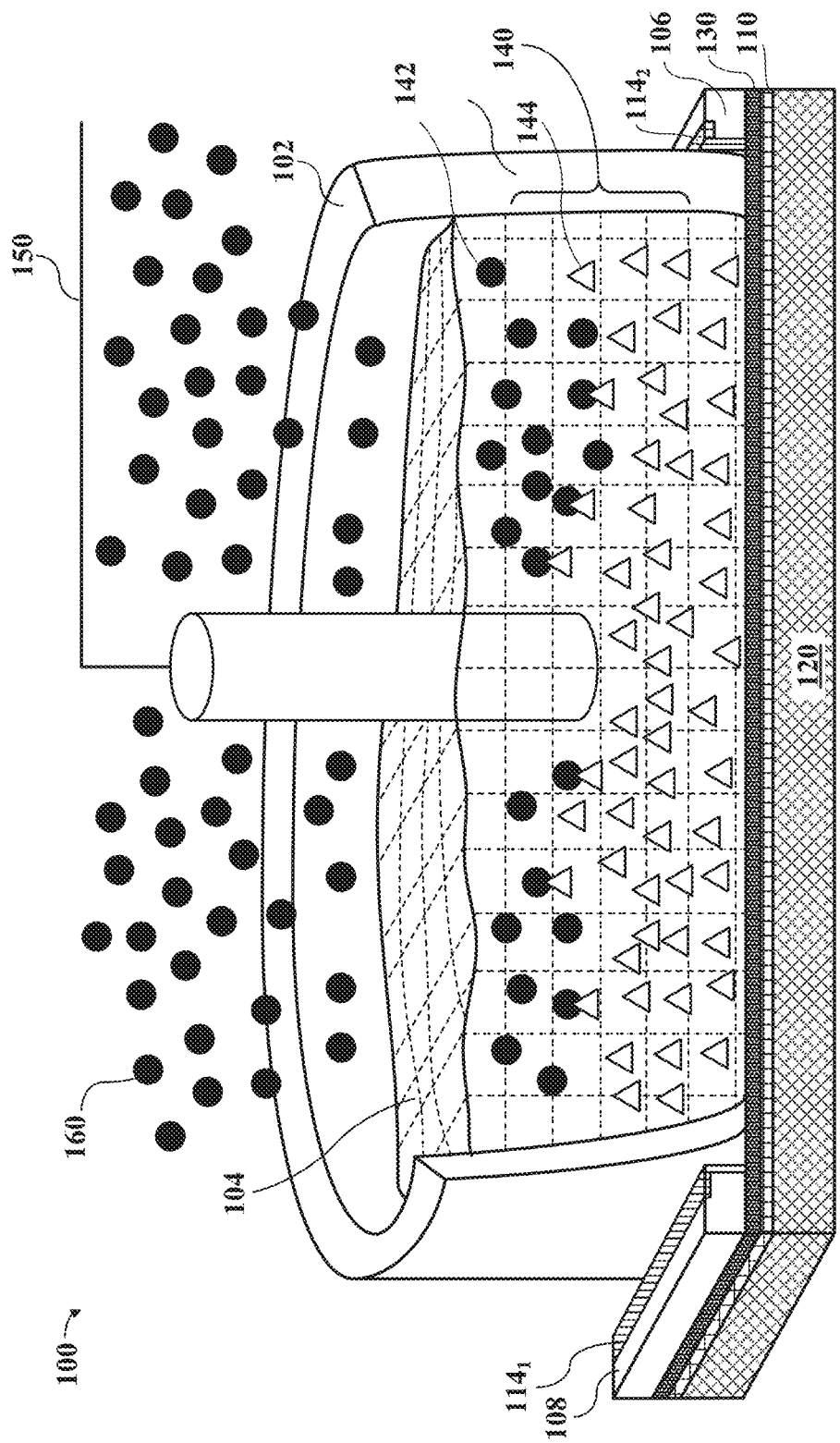
FIG. 1 shows a diagram depicting an example biosensor field-effect transistor (BioFET), according to some implementations.

The following description is directed to some example implementations for the purposes of describing innovative aspects of this disclosure. However, a person having ordinary skill in the art will readily recognize that the teachings herein can be applied in a multitude of different ways. Aspects of the subject matter disclosed herein can be implemented in any type of sensor or biosensor and can be used to detect the presence of a variety of different target analytes. As such, the disclosed implementations are not to be limited by the examples provided herein, but rather encompass all implementations contemplated by the attached claims. Additionally, well-known elements of the disclosure will not be described in detail or will be omitted so as not to obscure the relevant details of the disclosure.

As discussed, biological field-effect transistors (BioFETs) are a type of biosensor that includes a transistor for electrically sensing biomolecules or bio-entities. BioFETs detect changes in the surface potential of electrically conductive materials induced when specific target molecules (such as analytes) bind to certain biological recognition elements associated with the BioFET. Different biological recognition elements may exhibit a heightened response to different types of analytes, and therefore can be very selective in which analytes are detected. Conventional BioFETs may employ a two-dimensional (2D) graphene layer that may be functionalized to detect certain analytes. The 2D graphene layer may provide exposed surfaces suitable for providing biological receptors capable of binding with a target analyte, and may therefore form at least a part of the biological recognition element. Specifically, when a target analyte binds with the biological recognition element, chemical reactions between the target analyte and the biological recognition element can cause changes in one or more electrical properties or characteristics of the graphene layer. Changes in one or more electrical properties or characteristics of the graphene layer induced by the binding of the target analyte can cause changes in current flow and/or changes in the voltage differential between the source and drain terminals of the BioFET. The changes in current and/or voltage can be measured and used to indicate the presence (or absence) of analytes in the surrounding environment.

The liquid gate or back-gate voltage (e.g., as controlled by a gate electrode submerged in the electrolyte solution) may electrostatically control a charge carrier concentration in the channel between the source and drain of the transistor. As a result, the BioFET may be uniquely optimized by tuning the gate voltage for a given end-use application (e.g., to detect certain analytes and/or analyte concentration levels).

BioFETs can be integrated into digital microfluidic devices for Lab-on-a-Chip (LOC) applications. For example, a microfluidic device can control sample droplet transport while also enabling detection of bio-molecules, signal processing, and data transmission, using an all-in-one chip. BioFETs also may not require a labeling step and may use a specific molecular configuration (e.g., antibody, ssDNA) on the sensor surface to provide a desired selectivity. Some BioFETs display unique electronic and optical properties. Further, BioFETs may be prepared to be glucose-sensitive based on the modification of exposed surfaces of the conductive materials and/or the gate electrode with, for example, silicon oxide ($SiO_2$) nanoparticles and the enzyme glucose oxidase. These BioFETs may show enhanced analyte sensitivity and an extended lifetime compared to devices without $SiO_2$ nanoparticles.

Conventional BioFETs may not be able to selectively detect the presence or concentration levels of analytes in certain complex mixtures, such as serum or other bodily fluids. This may be due to the prevalence of relatively high levels of salt concentration in these complex mixtures, which can interfere with the analyte detection abilities of BioFETs. For accurate point-of-care (POC) diagnosis, a simple, yet selective detection of biomarkers at clinically relevant salt concentrations is critical to enable earlier diagnosis (e.g., at the site of an incident), which allows clinicians to make prompt triage and treatment decisions. Conventional BioFETs may exhibit adverse ionic screening effects at physiologically relevant conditions (e.g., 100-200 millimolar (mM) ionic concentration levels), which in turn can decrease their ability to accurately detect the presence and concentration levels of analytes.

In addition, the sensitivity of BioFETs to analytes may be limited due to a phenomenon known as Debye shielding in which electric fields are dampened by the presence of mobile charge carriers. Outside of a particular distance, known as the Debye length, the electrical influence of a charged molecule may be screened due to the movement of ions in the electrolyte solution. High concentration levels of salt, typically associated with accidents and emergency wound sites, may exacerbate this screening effect. In some instances, the Debye length may be less than 1 nm in biological solutions, such as serum and plasma. Increasing the Debye length by performing measurements in a low ionic strength solution or designing biosensors to detect only molecules larger than the Debye length may be able to mitigate the Debye shielding. Due to challenges associated with Debye shielding, many existing BioFETs operate only in relatively low ionic strength solutions or require a desalination process to reduce the ionic strength of the electrolyte solution. Mitigation of the ionic screening effect can be important for POC applications where analysis needs to be performed at or near the site of patient care with limited sample preparation (e.g., desalination) capability.

Aspects of the present disclosure recognize that using novel electrically conductive and bio-sensitive materials as a conductive channel in a BioFET may significantly improve performance of the BioFET. For example, one such novel electrically conductive and bio-sensitive material is graphene, which is a single-atom thick, 2D carbon-carbon bonded lattice that has unique mechanical and electrical properties. The relatively high mobility of charge carriers in graphene is useful in a range of electronic applications, including BioFETs. Graphene has been studied as a sensor material for many years, and its inherent, natural two-dimensional (2D) nature ensures that every atom is in contact with the surrounding environment, thereby improving sensitivity when compared to other, less structurally organized sensing materials.

In addition, graphene can be functionalized via a variety of techniques, and the binding of a particular analyte to exposed surfaces of graphene can change the electrical and/or conductivity properties of the graphene, thereby enabling detection of the analyte by measuring changes in the electrical conductivity (or changes in the electrical impedance) of graphene. In this way, BioFETs that use graphene as a sensing material may rely on selective adsorption of analytes that induces changes in the electrical conductance of the graphene. However, 2D graphene based BioFETs present limited sensitivity at high salt concentrations (such as in physiological solutions). Shielding of molecular charge by counter ions in solution may reduce BioFET sensitivity and thereby may limit practical applications of this technology, e.g., medical diagnostic applications.

To address various limitations of 2D graphene based BioFETs, implementations of the subject matter disclosed herein include three-dimensional (3D) graphenated materials such as a convoluted 3D graphene layer derived from a carbon-based ink as sensing materials for BioFETs. The 3D nature of the carbon provides a curvature and/or bending at the molecular scale at angles and/or orientations that can modulate the Debye length, thereby reducing the undesirable screening effect encountered at high salt concentration levels as described earlier. The 3D graphene layer may be deposited on an insulating layer (such as silicon dioxide) of the BioFET. The 3D graphene layer may be positioned within a well region containing an electrolyte solution that may receive an analyte (e.g., 2,4,6-Trinitrotoluene, "TNT"), and thereby potentially contact the analyte. Further, the 3D graphene layer may provide exposed surfaces that can be biofunctionalized with one or more molecular recognition elements that selectively bind with the analyte. The 3D graphene layers disclosed herein may provide an improved exposed surface area per unit volume, which results in improved binding of the molecular recognition elements with the analyte. For these reasons, the BioFETs disclosed herein may overcome challenges associated with detecting minute analyte levels in high salt concentration environments with relatively high selectivity.

FIG. 1 shows a diagram depicting an example biosensor field-effect transistor (BioFET) 100, according to some implementations. The BioFET may include a body 102, a well region 140 defined by the body 102, an electrolyte solution 104 contained in the well region 140, a source region 106, a drain region 108, a back gate 120, an insulating layer 110, a graphene layer 130, molecular recognition elements 144, an analyte 160, and a gate electrode 150. The configuration of the BioFET 100 may be changed to include additional, or fewer, components to facilitate sensitive and/or selective detection of the analyte 160. In some implementations, the BioFET 100 may detect a specific analyte at physiologically relevant conditions without experiencing adverse ionic screening effects other BioFETs. In some aspects, the BioFET 100 may detect a 2,4,6-trinitrotoluene "TNT" at 100-200 millimolar (mM) ionic concentration levels without experiencing adverse ionic screening effects other BioFETs. In other aspects, the BioFET 100 may detect other types of chemical, biological, or biochemical substances at 100-200 mM ionic concentration levels without experiencing adverse ionic screening effects other BioFETs.

The insulating layer 110 may be disposed on the back gate 120, which may include a semiconductor and/or a semiconducting material (e.g., silicon or polysilicon), either of which may alter in conductance and/or conductivity based on binding of the molecular recognition elements 144 with the analyte 160. In some aspects, the insulating layer 110 may be an oxide layer that electrically separates the graphene layer 130 from the back gate 120. In this way, the insulating layer 110 may separate the electrolyte solution 104 from the back gate 120, and thereby separate the analyte 160 contained in the well region 140 from the back gate 120. The source region 106 and the drain region 108 (e.g., which may be positioned opposite to the source region 106 as shown in FIG. 1) may be either directly or indirectly disposed on the insulating layer 110. The well region 140 may be positioned between the source region 106 and the drain region 108 and on the insulating layer 110, and may contain the electrolyte solution 104. The electrolyte solution 104 may be any suitable electrolyte solution used in BioFETs and/or the like.

In some implementations, the BioFET 100 may be fabricated on a substrate such as the back gate 120, which may have a thickness between approximately 0.1 mm and 1 mm. The back gate 120 may include and/or be composed of silicon, doped silicon, gallium arsenide, or a conducting polymer. The insulating layer 110 disposed on the back gate 120 may be 10 nm to 1000 nm thick, and may be composed of silicon dioxide ($SiO_2$). In the alternative, the insulating layer 110 may be composed of silicon oxide, hafnium oxide, aluminum oxide, titanium dioxide, or an insulating polymer.

In contrast to conventional BioFETs that include a 2D graphene layer, the BioFET 100 of FIG. 1 includes a 3D graphene layer 130 disposed on the insulating layer 110. As discussed, the graphene layer 130 may be composed of convoluted 3D graphene derived from carbon-based inks. In some aspects, a chemically inert passivation layer 114 including a first portion $114_1$ and a second portion $114_2$ may be partially disposed on the graphene layer 130, the source region 106 and/or the drain region 108. The passivation layer 114 may operate with the gate electrode 150 to control and/or regulate electric current flow through the graphene layer 130. The first portion $114_1$ and/or the second portion $114_2$ of the passivation layer 114 may regulate and/or prevent exposure of the drain region 108 and the source region 106, respectively, to an external environment that can include one or more analytes 160. A window (not shown in FIG. 1 for simplicity) may be positioned between the source region 106 and the drain region 108. Removal of the window from the BioFET 100 may expose the analyte 160 to the electrolyte solution 104. The analyte 160 present in the surrounding environment may diffuse throughout the electrolyte solution 104 and bind with the molecular recognition elements 144 provided by and/or associated with the graphene layer 130.

The source region 106 may be at least partially covered by the second portion $114_2$ of the passivation layer 114, and the drain region 108 may be at least partially covered by the first portion $114_1$ of the passivation layer 114, as shown in FIG. 1. In this way, the passivation layer 114 may isolate the source region 106 and/or the drain region 108 from the analyte 160 contained in the electrolyte solution 104. In the alternative, the electrolyte solution 104 may be physically isolated from the source region 106 and/or the drain region 108 using a polymer well region (e.g., the body 102 of the BioFET of FIG. 1). Further, the gate electrode 150 may be positioned in the electrolyte solution 104 to regulate the voltage and/or the current of the BioFET 100. In some implementations, the 3D graphene layer 130 may be covered by a permeable polymer layer (not shown in FIG. 1 for simplicity), such polyethylene glycol (PEG), to stabilize bound receptor molecules and prevent non-selective binding of the analyte to the graphene surface.

In one implementation, the 3D graphene layer 130 may form an electrically-conductive channel and contact the source region 106 and/or the drain region 108, as shown in FIG. 1. The 3D graphene layer 130 may include exposed carbon surfaces that can be biofunctionalized (e.g., modified with a material to have a particular biological function and/or stimulus, whether permanent or temporary, while at the same time being biologically compatible) with the molecular recognition elements 144. In several particular examples, the molecular recognition elements 144 may include receptors, biological receptors ("bioreceptors,") biological materials, biochemical materials and/or probe molecules, any of which may selectively bind with the analyte 160, and thereby correspond with detection of particular variants of the analyte 160. In some aspects, the selectively binding may be associated with how a particular ligand may prefer binding with one receptor more than with another receptor. Specifically, binding of the analyte 160 to the molecular recognition elements 144 and/or convoluted 3D graphene in the graphene layer 130 may produce a change in the electric conduction properties of the convoluted 3D graphene. In some aspects, the change in the electric conduction properties may be proportional to and/or based on the molecular mass and/or length of the bioreceptors. In one implementation, bioreceptors may be less than 15 kiloDaltons (kDa) in molecular mass and/or less than 10 nanometers (nm) in length.

In some implementations, biofunctionalization of the bioreceptors (e.g., one type of the molecular recognition elements 144) may include reductive covalent functionalization, application and/or usage of non-covalent chemistry using pyrenes, and/or include direct stacking of molecules (e.g., biomolecules) on exposed surfaces of the graphene layer 130. The reductive covalent functionalization and/or the usage of the non-covalent chemistry may use pyrenes to yield carboxylic acids on exposed surfaces of the molecular recognition elements 144 and/or the graphene layer 130. Further, the carboxylic acids may chemically react with amines provided by bioreceptors on exposed surfaces of the molecular recognition elements 144 and/or the graphene layer 130 by using 1-ethyl-3-(3-dimethylaminopropyl)carbodiimide hydrochloride (EDC) and/or N-hydroxysulfosuccinimide (sulfo-NHS). In some particular examples, the carboxylic acids may include peptide and/or amino acid sequences, such as peptide or amino acid sequences including: "His-Ser-Ser-Tyr-Trp-Tyr-Ala-Phe-Asn-Asn-Lys-Thr-Gly-Gly-Gly-Gly-Trp-Phe-Val-Ile," and "Trp-His-Trp-Gln-Arg-Pro-Leu-Met-Pro-Val-Ser-Ile." In addition, or the alternative, the graphene layer 130 may be covalently functionalized with diazonium salts and/or detect mercury (Hg) by including bioreceptor molecules (e.g., as a part of the molecular recognition elements 144) functionalized with an amino acid sequence having a formula as follows: "Thr-Thr-Cys-Thr-Thr-Thr-Cys-Thr-Thr-Cys-Cys-Cys-Cys-Thr-Thr-Gly-Thr-Thr-Thr-Gly-Thr-Cys."

In this way, certain bioreceptors may selectively bind with a particular analyte (e.g., TNT), and thereby produce a corresponding change in an electrostatic potential of the insulating layer 110 and/or the back gate 120. In one implementation, changes in the electrostatic surface potential of the back gate 120 may be associated with a change in an electric current measured between the source region 106 and the drain region 108 at a particular bias and/or gate voltage (VGs) applied by the gate electrode 150. As a result, changes in the electric current may indicate the presence of the analyte 160 in the electrolyte solution 104 within the well region 140 during operation of the BioFET 100. For example, in operation, the gate electrode 150 may submerge into the electrolyte solution 104 and toggle between activated and deactivated states, for example, such that the gate electrode 150 applies the gate voltage to the channel region of the BioFET 100 only during activated state. In this way, the gate electrode 150 may regulate conductance through the graphene layer 130 and/or render the BioFET 100 as a transconductance-type device.

In some implementations, a method of performing a sensing measurement with the BioFET 100 of FIG. 1 may include introducing a liquid sample (e.g., the electrolyte solution 104) to the graphene layer 130 after biofunctionalization of the graphene layer 130 and/or molecular recognition elements 144 and prior to hybridization of the biofunctionalized graphene layer 130 with the analyte 160. The length of time necessary for the hybridization may depend on the individual bimolecular interaction of interest and may be up to 1 hour (hr). During electrical sensing measurements performed by the BioFET 100, the source bias may be held at a constant 0.1 V and the gate voltage may be slowly transitioned from −1V to 1 V. In some instances, a smaller gate voltage range may be used depending on the individual sensor variability. Electric current may be measured simultaneously to determine minimum current of the graphene layer 130, where such a determination is used to determine the Dirac voltage and compared with the pristine sensor to assess analyte concentration levels of the analyte 160.

In some implementations, the hybridization of a charged molecule (such as the analyte 160) with the graphene layer 130 may induce changes in various electrical properties of the graphene layer 130. In one or more particular examples, a negatively charged molecule will shift the Dirac voltage in the positive direction, while a positively charged molecule will shift the Dirac voltage in the negative direction. This occurs because the electrical influence of a hybridized molecule such as the analyte 160 may induce carrier density changes in the molecular recognition elements 144 and/or the graphene layer 130. The shift in Dirac voltage is directly proportional to the density of bound analytes, and therefore the concentration of the analyte in the liquid sample. In some aspects, the BioFET 100 may also be used for real-time measurements by holding both the source and gate bias constant. The binding of a positively charged analyte 160 will cause a decrease in current across the graphene layer 130 and/or the molecular recognition elements 144 if the gate bias is less than the Dirac voltage, and an increase in current if the gate bias is greater than the Dirac voltage. The opposite will occur for a negatively charged analyte. The shift in current is proportional to the concentration of the analyte in the liquid sample. The time dependent nature of such measurements may enable the quantification of the binding kinetics between the molecular recognition elements 144 and the analyte 160 of interest in the electrolyte solution 104.

Figure 2:
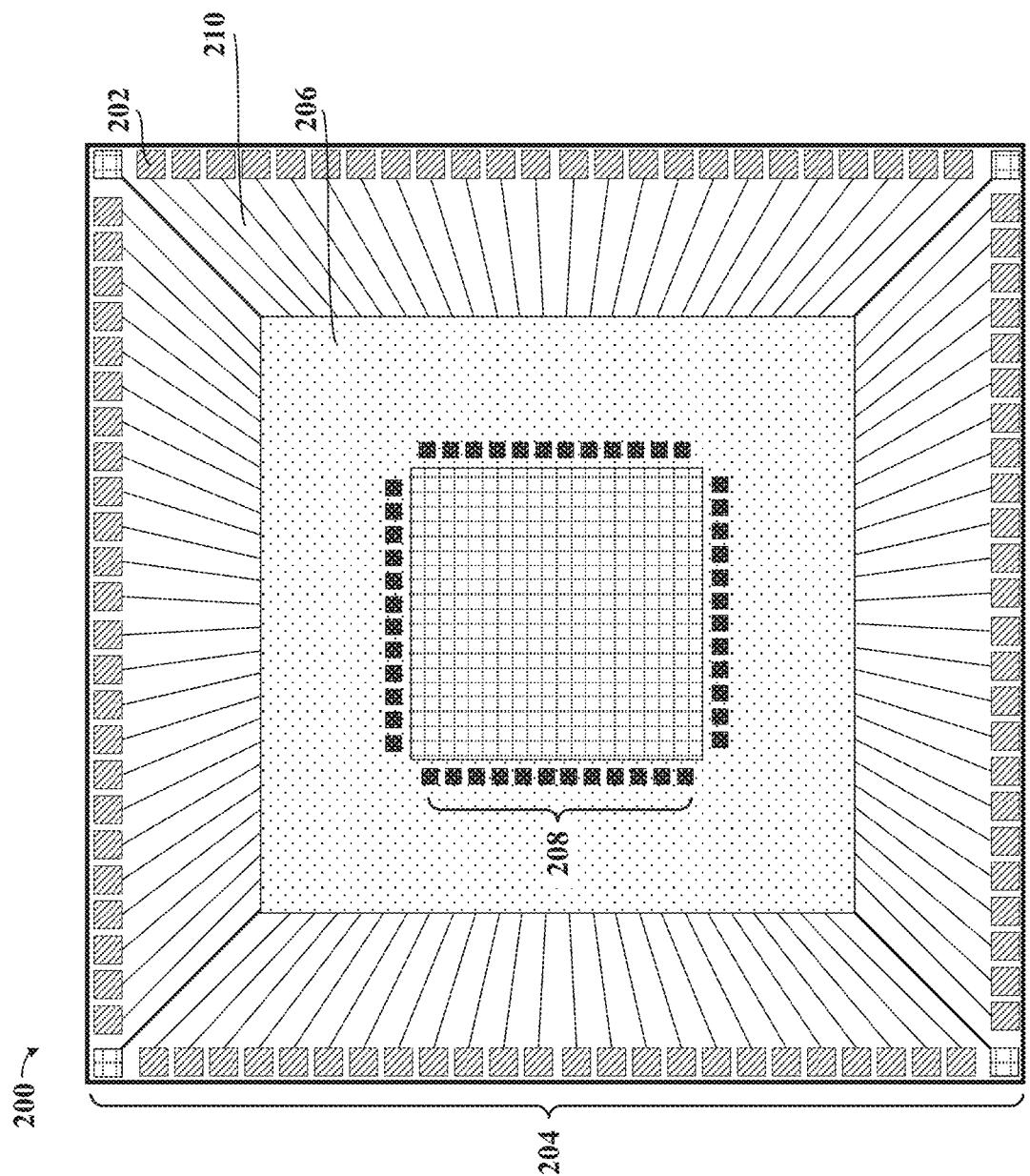
FIG. 2 shows a top-down view of an array including multiple BioFETs of FIG. 1, according to some implementations.

FIG. 2 shows a top-down view of an array 200 including multiple BioFETs 202 of FIG. 1, according to some implementations. In various implementations, each BioFET 202 may be one implementation of the BioFET 100 of FIG. 1. In some aspects, the array 200 may include the BioFETs 202 organized into several linear arrangements 204 that surround a passivation layer 206 and use a common gate voltage. Additional electrodes 208 may be provided to control electrical contacts and/or current flow associated with the array 200. Further, the array 200 may be reconfigured to accommodate any variety of sensing conditions and target analyte concentration levels. In one implementation, the BioFETs 202 may be electrically connected to a controller (not shown in FIG. 2 for simplicity).

The array 200 may include a substrate 210 similar to the back gate 120 of the BioFET 100 of FIG. 1. The substrate 210 may be silicon, and may have a size of approximate one square centimeter (1 $cm^2$). The linear arrangements 204 of BioFETs, the additional electrodes 208, and/or the passivation layer 206 may be deposited and/or otherwise disposed on the substrate 210. In one implementation, the additional electrodes 208 may be defined on the substrate 210 using photolithography. In addition, or the alternative, the additional electrodes 208 may include one or more gold (Au) source and/or drain regions coupled with a central platinum (Pt) liquid gate electrode. In one implementation, the array 200 may include forty-eight (48) BioFETs 202, where each BioFET 202 may include channels similar to the graphene layer 130 of the BioFET 100 of FIG. 1. For example, each BioFET 202 may include ten (10) channels (not shown in FIG. 2 for simplicity), where each channel may be approximately 10 micrometers (μm) in length and/or width. The array 200 may expose only the platinum gate electrode and/or the channels of each BioFET 202 to an analyte during operation. In some aspects, the array 200 may provide a high relatively high detection sensitivity (e.g., 100-200 millimolar (mM) ionic concentration levels) by operating multiple BioFETs 202 concurrently.

In addition, or the alternative, the substrate 210 may have a thickness in an approximate range from 0.1 to 1 mm. The substrate 210 may include silicon, doped silicon, gallium arsenide or a conducting polymer. In one implementation, an insulating layer (such as the insulating layer 110 of FIG. 1) may be disposed on the substrate 210. The insulating layer may be 10 to 1000 nanometers (nm) thick, and may include silicon dioxide, silicon oxide, hafnium oxide, aluminum oxide, titanium dioxide, and/or an insulating polymer. In addition, a total area of 3D graphene may be in an approximate range from may range from 1 to 81 $cm^2$. Further, 3D graphene may be patterned into an array, where various 3D graphene channels (not shown in FIG. 2 for simplicity) may vary in length from 10 μm to 1 cm, thereby resulting in a total channel area in an approximate range from 100 $\mu m^2$ to 1 $mm^2$.

Carrier mobility of the 3D graphene may range from 100 to 10,000 $cm^2$/Vs, with a sub-range range between 1,000 and 5,000 $cm^2$/Vs. The array 200 may maintain a particular voltage bias at a source region, and thereby accommodate voltage applied to the substrate 210 swept over a range. As a result, the array 200 may measure current values of multiple 3D graphene materials associated with the BioFETs 202, a phenomenon also referred to as "measuring the transfer characteristics" of the array 200. In one implementation, at a particular gate voltage, current values measured across various 3D graphene channels may be at a minimum, e.g., also known as a Dirac point. Each of the BioFETs 202 may have a corresponding Dirac point, which may be between 0 and 20 V, when measured under dry conditions, with no liquid sample covering the 3D graphene channels. In circumstances where a liquid sample (e.g., similar to the electrolyte solution 104 of FIG. 1) is present, the platinum liquid gate electrode may be used to apply a gate bias, yielding a Dirac point at one or more corresponding BioFETs 202 of between 0 and 1 V.

In some implementations, the array 200 may perform sensing measurement operations, which may include introducing liquid samples to various 3D graphene channels of the BioFETs 202. Hybridization of molecules with the 3D graphene channels may occur within up to 1 hour after initial exposure to the analyte. During electrical sensing measurements, the source bias may be held at a constant 0.1 V and a gate voltage applied through the platinum liquid gate electrode may be slowly transitioned from −1 to 1 V. In some aspects, a smaller gate voltage range may be used depending on sensor variability of the BioFETs 202. The electric current conducted through 3D graphene channels may be measured across the BioFET 202 devices simultaneously and used to determine the Dirac voltage and compared with a pristine (e.g., unused) version of the array 200.

Hybridization of charged molecules with biofunctionalized 3D graphene in various BioFETs may, in some aspects, induce a change in electrical properties of respective 3D graphene channels. For example, negatively charged molecules may shift the Dirac voltage in the positive direction, while positively charged molecules may shift the Dirac voltage in the negative direction. This phenomena may occur as the electrical influence of hybridized molecules induces carrier density changes in respective 3D graphene channels. Shifts in the Dirac voltage may be directly proportional to the density of bound analytes and the concentration of the analyte in a given liquid sample. In one or more particular examples, shifts in the Dirac voltage for a 1 attoMolar (aM) solution of single stranded DNA may be up to 10 mV.

The array 200 may also be used for real-time analyte concentration level measurements by holding both source and gate bias constant. In this way, binding of a positively charged analyte may cause a decrease in electric current if a gate bias is less than the Dirac voltage, and an increase in current if the gate bias is greater than the Dirac voltage. In contrast, the opposite phenomena may occur for a negatively charged analyte. Observed shifts in electric current may be proportional to the concentration of the analyte in the liquid sample delivered to the array 200. In addition, the time dependent nature of such measurements correspondingly enables quantification and study of binding kinetics between biofunctionalized receptor molecules (e.g., associated with and/or provided by 3D graphene channels of the BioFETs 202) and an analyte of interest in the liquid sample.

In some implementations, one reference electrode (e.g., similar or identical to the gate electrode 150 of FIG. 1) may be used for all BioFETs 202 in the array 200 of FIG. 2. In this case, the BioFETs 202 and/or other components associated with the array 200 may be electrically connected to an appropriate controller to bias the source and/or drain regions of each BioFET 202 disposed on the array 200. In some implementations, the total area of the 3D graphene growth may range from 1 to 81 cm² and be patterned into the array 200, which may include dozens of BioFETs 202. The distance between the source and drain regions, and thus the 3D graphene channel length, in the array 200 may vary from 10 μm to 1 cm, thereby producing a total channel area in an approximate range between 100 μm² to 1 mm².

Figure 3:
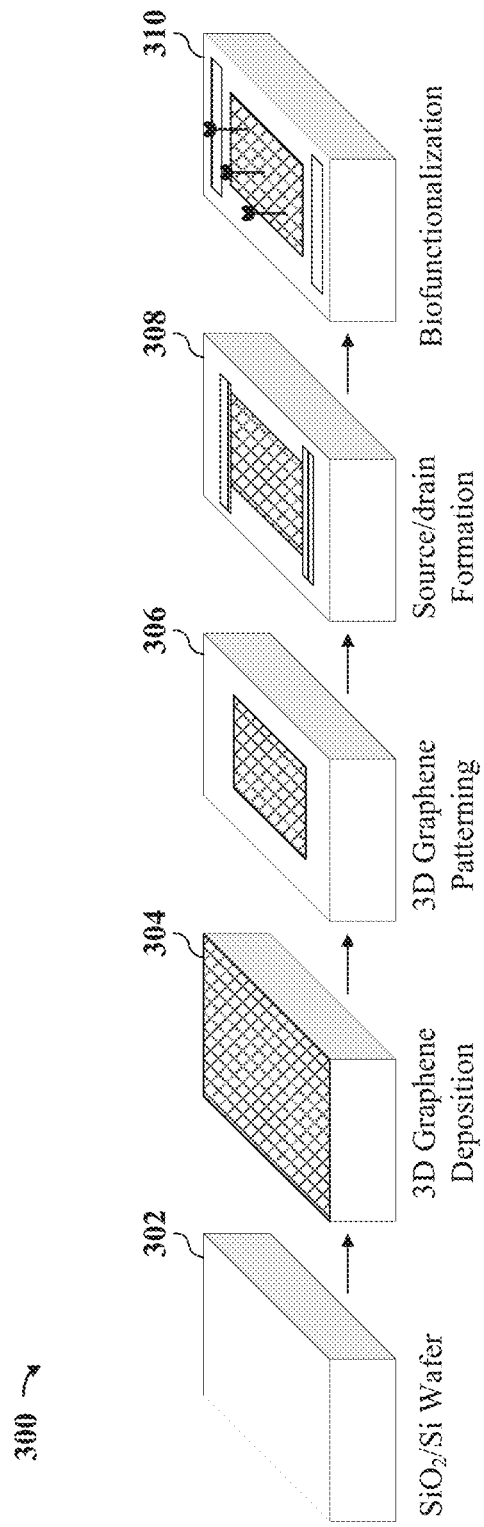
FIG. 3 shows a diagram depicting a process for manufacturing a BioFET, according to some implementations.

FIG. 3 shows a diagram depicting an operation 300 for manufacturing a BioFET, according to some implementations. At 302, a 3D graphene may be prepared by adding 1.0 milligrams (mg) of a microwave-synthesized graphene in 10 milliliters (mL) of N-Methyl-2-pyrrolidone (NMP). In some implementations, the dispersion may be distributions of monolithic 3D graphene over defined areas, such as used for the graphene layer 130 of the BioFET 100 of FIG. 1. The resulting solution may then be sonicated using, for example, a probe sonicator set at 30% amplitude (Sonics VCX 750) for 2 hours. Sonication may result in a relatively uniform dispersion of the 3D graphene, which may have an average particle size diameter per mean volume (MV) of 70 nm (e.g., as measured using a dynamic light scattering method). The resulting 3D graphene dispersion may then be centrifuged at 8000 rpm for 20 mins. Precipitates formed from centrifugation may be discarded, thereby leaving sheets of pristine (e.g., having an impurity content of less than 1 wt. %) 3D graphene in surrounding supernatant.

At 304, fabrication of BioFETs 100 may use p-type silicon wafers, each having a 300 mm thickness and/or <20 Ohm/cm resistance. In some implementations, the silicon wafers may be each cut into a 1 inch (in)×1 in dimension and cleaned using Radio Corporation of America (RCA) cleaning methods prior to completion of a thermal oxidation step. For example, 70 mL of deionized water, 15 mL of 27% ammonium hydroxide and 15 mL of 30% hydrogen peroxide may be added to form a solution and heated to 70° C. Diced silicon wafers may be submerged into the resulting solution for 30 minutes and later washed with an excess quantity of deionized water. In preparation for deposited of the insulating layer 110, the cleaned silicon wafer may be placed on a clean alumina device inside an oxidation furnace, where a dry oxidation operation may be performed at 1000° C. by flowing oxygen at 5 sccm.

Completion of the dry oxidation operation may result in deposition and/or formation of approximately 300 nm of thermal oxide (e.g., such as the insulating layer 110) on exposed surfaces the silicon wafer. The silicon wafer, having approximately 300 nm of thermal oxide deposited thereon, may now be referred to generically as a "substrate" while progressing through the various remaining operations outlined in blocks 302, 304, 306, 308, and 310 of the operation 300. The 3D graphene dispersion prepared in Step 1 may be then coated (at 304) onto the thermal oxide of the substrate by the following example process. Initially, a piranha solution (a 3:1 mixture of $H_2SO_4$ and $H_2O_2$) may be used to remove any organic residue on exposed surfaces of the substrate. The piranha solution may then be rinsed off of the substrate using deionized water, which may be dried by a nitrogen gas flow stream.

Next, the substrate may be submerged in a 2% concentration solution of aminopropyltriethoxysilane (APTES) for three hours. Submergence of the substrate in the 2% APTES solution may result in a deposition of a layer of APTES on the thermal oxide and/or the substrate, which may activate the thermal oxide. Next, the substrate may be washed to remove excess APTES physiosorbed on exposed surfaces of the thermal oxide and/or the substrate. Finally, the 3D graphene dispersion prepared in Step 1 may be spin coated at 3000 rpm for one (1) minute onto exposed surfaces of the thermal oxide activated with APTES. The 3D graphene produced thus far in the operation 300 may then be washed with an excess quantity of water and thermally annealed at 150° C. to remove any residual solvent materials, leaving behind a uniform layer of 3D graphene that can be used as the 3D graphene layer 130 within the BioFET 100 of FIG. 1.

At 306, the substrate, after being prepared and/or processed at 302 and 304, may be patterned. In one or more particular examples, the substrate may be patterned as a single BioFET (e.g., the BioFET 100 of FIG. 1) and/or as an array of multiple BioFETs (e.g., the array 200 of FIG. 2) using a photomask and/or a marker mask. In this way, the photomask and/or the marker mask may be used for aligning the substrate in further photolithographic processes to, for example, define features on the substrate and create the BioFET.

A positive photoresist may be spun coat over the 3D graphene dispersion coating on the thermal oxide at 4000 rpm for 50 seconds (s), then heated at 100° C. for one minute. The positive photoresist may include, for example, a photomask with the image of a graphene FET channel array with 40 or 48 devices and/or device regions. Each device image outlined by the photomask may have, for example, a channel length and/or width equal to 10 μm, and may be placed over the substrate (e.g., in hard contact with the substrate), prior to flooding the substrate (while covered with the photomask) with ultraviolet (UV) light. The resultant substrate may be then immersed in developer for one minute (min), such that 3D graphene channel regions covered by photoresist remain. The substrate may then be placed in a plasma etcher and exposed to oxygen plasma for one min at 100 W prior to being cleaned with acetone and/or isopropanol. As a result of these processes, 3D graphene dispersion may be removed from the substrate except in areas defined by the photomask, e.g., referred to as the graphene FET "channel areas."

At 308, the source and drain regions may be formed or defined using photolithography in a procedure similar to that described with reference to the graphene patterning at 306. In some aspects, the source and drain regions may be defined using chromium (Cr) and/or gold (Au) thin films, each with a thickness of approximately 30 nm and 100 nm, respectively. The chromium or gold films may be deposited onto the substrate (e.g., as shown by the source 106 and/or the drain 108 of FIG. 1) in a thermal evaporator at a rate of 0.1 nm/s. Afterwards, lift-off of excess metal may be achieved by immersion of the substrate in acetone for one hour (hr), followed by gentle rinsing with an excess quantity of water.

Procedures used to fabricate the source and drain regions including chromium and/or gold as outlined above may be repeated to fabricate a platinum (Pt) central liquid gate electrode that can be used as the gate electrode 150 of the BioFET 100 of FIG. 1. In this way, a final BioFET array (such as the array 200 of FIG. 2) may have an overall array size of 1 in×1 in or 1 centimeter (cm)×1 cm with 48 BioFETs 100. In some implementations, the source and drain regions may be fabricated to be 100 nm thick and at positions 10 mm apart from each other. In some aspects, either a chromium, titanium, or nickel layer (e.g., with approximate thickness of 2-5 nm) may be deposited on the insulating layer 110 of FIG. 1 to improve adhesion with the gold layer deposited on the chromium layer. The gold layer provides low resistance ohmic contact with carbon materials contained in or associated with the graphene layer 130 of FIG. 1, while the chromium layer provides the required adhesion to exposed surfaces of the insulating layer 110. This combination of the adhesion layer with the gold layer may limit and/or minimize ohmic resistance encountered with the 3D graphene during operation of the BioFET 100 while maintaining good adhesion to the insulating layer 110. After liftoff of any residual metal-containing contaminants in contact with the source and drain regions, the substrate may be placed in 1-methyl-2-pyrrolidone (NMP) for four hours to remove residual photoresist from exposed 3D graphene surfaces.

At 310, 3D graphene materials deposited onto the thermal oxide layer of the substrate may be prepared via biofunctionalization of exposed surfaces of the 3D graphene, which can then bind to analytes selected for detection. For example, bioreceptors may be bound to exposed surfaces of the 3D graphene to facilitate a biological receptor-analyte interaction, resulting in the binding of bioreceptors with analyte, where such binding is associated with a change in electric current in the 3D graphene layer. Various graphene biofunctionalization methods may be used including, for example: (1) reductive covalent functionalization, (2) non-covalent chemistry using pyrenes, or (3) direct stacking of molecules on the graphene surface. Approaches (1) and/or (2) may yield carboxylic acids on exposed surfaces of the 3D graphene.

In some implementations, the carboxylic acids may chemically react with amines provided by the bioreceptors using 1-ethyl-3-(3-dimethylaminopropyl)carbodiimide hydrochloride (EDC) and N-hydroxysulfosuccinimide (sulfo-NHS). Compounds such as EDC and/or sulfo-NHS can be used to activate carboxylic groups for amine attachment to enhance crosslinking chemistry occurring within or between carboxylic groups, bioreceptors, 3D graphene and/or any combinations thereof. For example, several different peptide (e.g., amino acid) sequences may be selected as biological receptors such as the molecular recognition elements 144 of FIG. 1 based on electronic and fluorescence spectroscopy for use in TNT BioFET sensors. The amino acid sequences (e.g., the two different peptide sequences) may include: Anti-TNT Peptide Sequence (1): His-Ser-Ser-Tyr-Trp-Tyr-Ala-Phe-Asn-Asn-Lys-Thr-Gly-Gly-Gly-Gly-Trp-Phe-Val-Ile, and Anti-TNT Peptide Sequence (2): His-Ser-Ser-Tyr-Trp-Tyr-Ala-Phe-Asn-Asn-Lys-Thr-Gly-Gly-Gly-Gly-Trp-Phe-Val-Ile.

In some implementations, the BioFETs disclosed herein may be covalently biofunctionalized using diazonium salts synthesized from tetrafluoroboric acid. In this case, the substrate may be immersed in a solution of 4-carboxybenzene diazonium tetrafluoroborate at a concentration of 2.5 mg/mL for one hr at 40° C. to create $sp^3$ hybridization sites terminating in carboxylic acid groups. The substrate may be then rinsed in acetone, methanol, and deionized water. Carboxylic acid groups on the 3D graphene of the substrate may be activated by immersion in a solution of 2 mg of 1-ethyl-3-(3-dimethylaminopropyl)carbodiimide (EDC) and 6 mg of N-hydroxysulfosuccinimde (NHS) in 5 mL of 50 mM 2-(N-Morpholino) ethanesulfonic acid for 1 hr, followed by a deionized (DI) water rinse. The BioFETs are then biofunctionalized by pipetting an aqueous solution of peptides at a concentration of 1 μg/mL and rinsing in DI water after 1 hr of pipetting. Residual active NHS groups are quenched with an immersion in 1 M ethanolamine for 15 minutes.

In one alternative, the BioFETs disclosed herein may be non-covalently functionalized using a pyrene derivative. For example, 1-pyrene carboxylic acid in methanol may be applied to exposed surfaces of the 3D graphene layer 130 to non-covalently attach molecules with terminating carboxyl groups to the 3D graphene layer 130. The EDC-NHS treatment may then be applied in the manner described above to activate these groups for functionalization with the desired receptor molecule (e.g., TNT).

In addition, or as a further alternative, other non-covalent functionalization techniques may be used to passivate the 3D graphene layer or channel 130 and add a polyethylene glycol (PEG) layer for stabilization and proper spacing of bioreceptor molecules. The substrate may be then immersed in a solution of 1 mM 1-pyrenebutryic acid and 0.25 mM mPEG-pyrene in ethanol for 1 hr. Afterwards, the substrate may be washed in ethanol and DI water, then the EDC-NHS treatment may be applied in the same manner as described above to active the carboxyl groups.

Figure 4A:
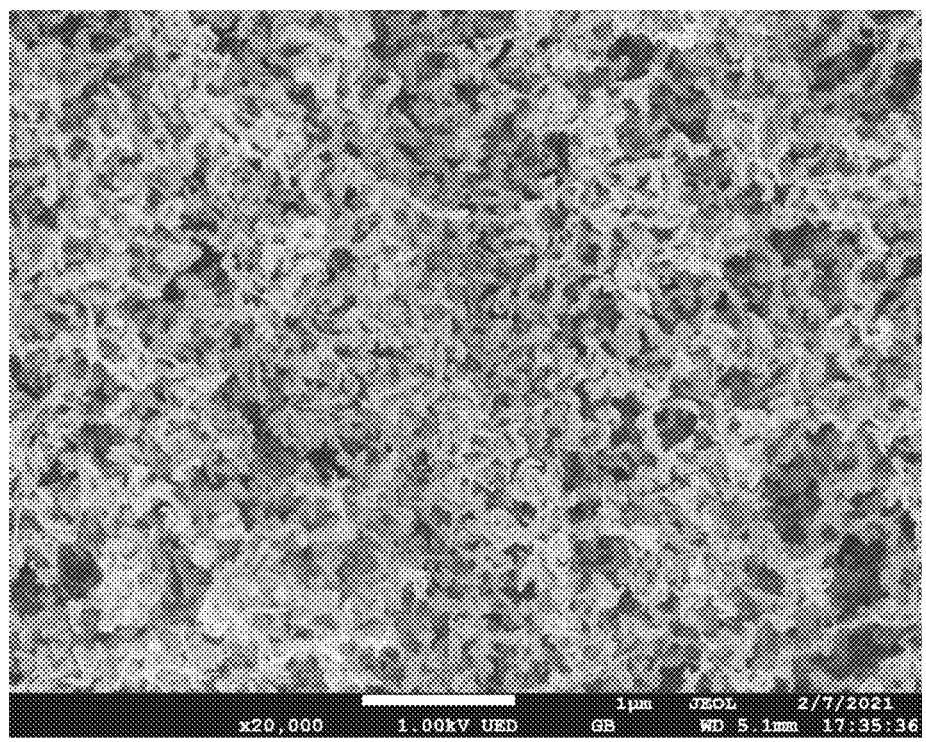
FIGS. 4A and 4B show scanning electron microscope (SEM) images of an example 3D graphene, according to some implementations.
Figure 4B:
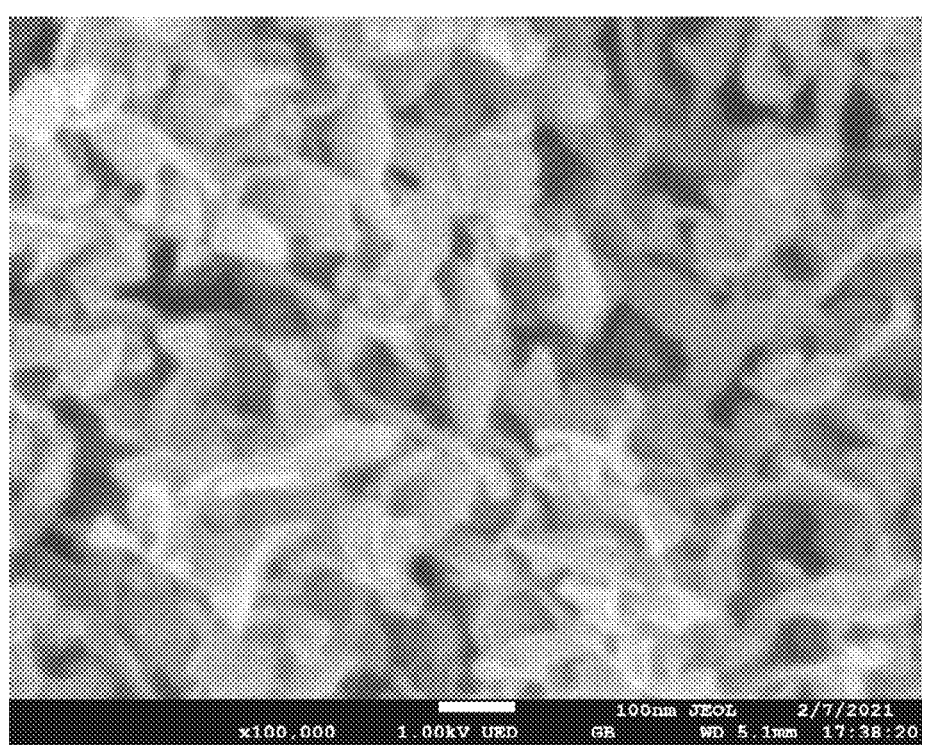
Figure 5A:
FIGS. 5A and 5B show transmission electron microscope (TEM) images of an example 3D graphene, according to some implementations.
Figure 5B:
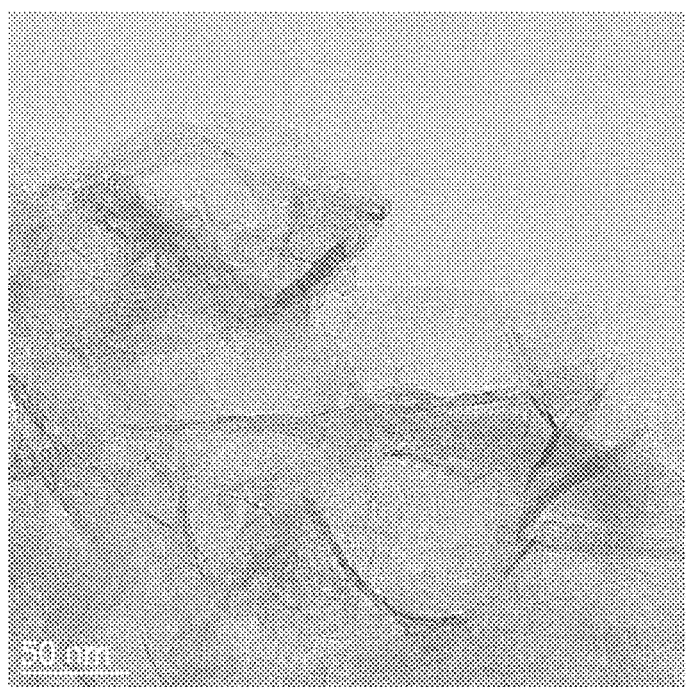
Figure 6A:
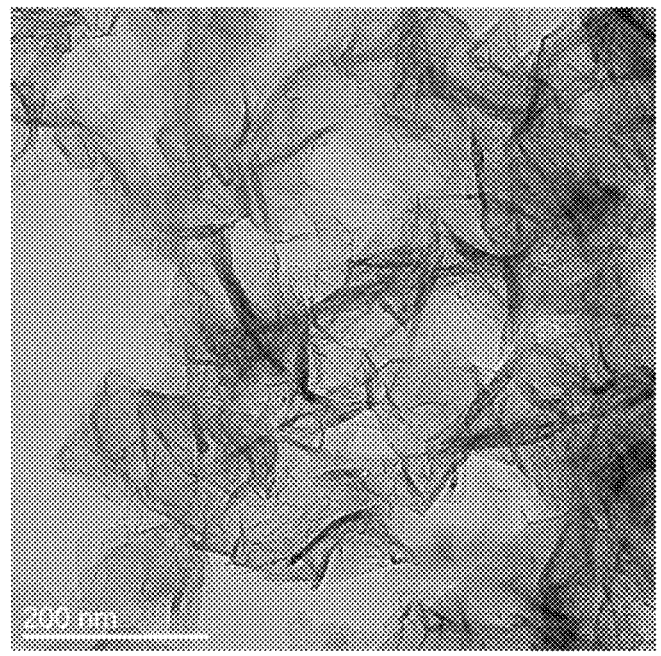
FIGS. 6A and 6B show TEM images of an example 3D graphene, according to other implementations.
Figure 6B:
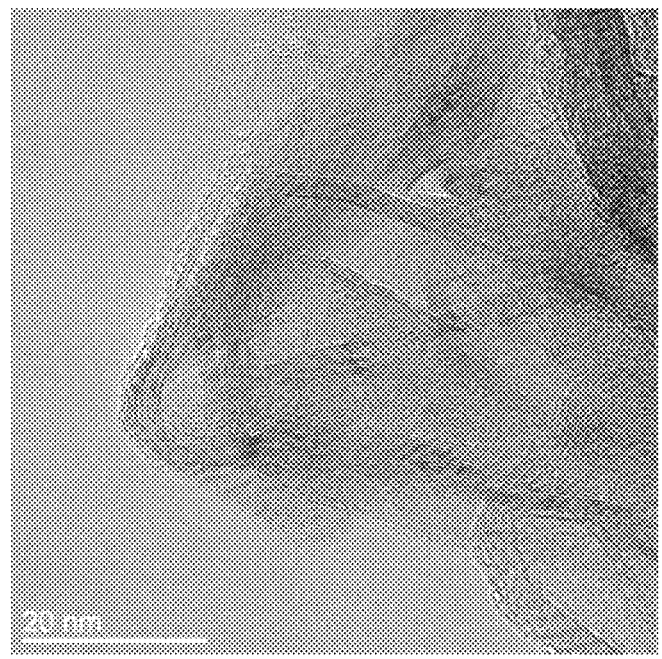

FIGS. 4A and 4B show scanning electron microscope (SEM) images 400A and 400B of an example 3D graphene according to some implementations, FIGS. 5A and 5B show transmission electron microscope (TEM) images 500A and 500B of an example 3D graphene according to some implementations, and FIGS. 6A and 6B show TEM images 600A and 600B of an example 3D graphene, according to other implementations. In some implementations, the images 400A, 400B, 500A, 500B, 600A, and 600B depict various aspects of convoluted 3D graphene (e.g., also referred to as "3D graphene sensing materials") that may be employed in the graphene layer 130 of the BioFET 100 of FIG. 1 and/or the BioFETs 202 of the array 200 of FIG. 2. In contrast to a 2D graphene material, the 3D graphene sensing materials disclosed herein may be constructed to have a convoluted 3D structure to prevent graphene restacking, avoiding several drawbacks of using 2D graphene as a sensing material. This process also increases the areal density of the materials, yielding higher analyte adsorption sites per unit area, thereby improving chemical sensitivity, as made possible by a corresponding library of carbon allotropes used to customize the sensor arrays disclosed herein to chemically fingerprint leaked analytes for multiple applications.

The structured carbon materials shown in FIGS. 4A-4B, 5A-5B, and 6A-6B may be produced using flow-through type microwave plasma reactors configured to create pristine 3D graphene particles, aggregates, agglomerates and/or the like continuously from a hydrocarbon gas (e.g., methane) at near atmospheric (~1 atm) pressures. Operationally, as the hydrocarbon flows through a relatively hot zone of a plasma reactor, free carbon radicals may be formed that flow further down the length of the reactor into the growth zone where 3D carbon particulates (based on multiple 2D graphenes joined together) are formed and collected as fine powders. The density and composition of the free-radical carbon-inclusive gaseous species may be tuned by gas chemistry and microwave (MW) power levels. By controlling the reactor process parameters, these reactors may produce carbons with a wide, yet tunable, range of morphologies, crystalline order, and sizes (and distributions). For example, possible sizes and distributions may range from flakes (few 100 nm to μm wide and few nm thin) to spherical particles (approximately between 10 nm to 99 nm in diameter) to graphene clusters (approximately between 10 μm to 99 μm in diameter). The 3D nature of the materials prevents agglomeration effectively allowing for the materials to be disseminated as un-agglomerated particles. As a result, highly responsive and selective sensing materials can be produced. Graphene, an atomically thin two dimensional (2D) material, has many advantageous properties for sensing, including outstanding chemical and mechanical strength, high carrier mobility, high electrical conductivity, high surface area, and gate-tunable carrier density.

To improve chemical selectivity, the 3D graphenes disclosed herein may be functionalized with various reactive materials in a manner such that the binding of target molecules and associated carbonaceous materials may be optimized. This functionalization step, along with the ability to measure the complex impedance of the exposed sensor, may be critical for efficient and selective detection of analytes. For example, different metal nanoparticles or metal oxide nanoparticles may be decorated on the surface of 3D graphenes to selectively detect hydrogen peroxide as peroxides are known to react with different metals. Further, nanoparticle decorated graphene structures may act synergistically to offer desirable and advantageous properties for sensing applications.

Aspects of the present disclosure recognize that BioFETs (e.g., the BioFET 100 of FIG. 1 and/or the array 200 of FIG. 2) various uses thereof. In some particular examples, such FET devices may include a conductive channel (e.g., the graphene layer 130 of the BioFET 100 of FIG. 1), which may be formed of graphene petal-shaped nanosheets, whereby each petal structure is composed of one or many graphene layers. The 3D graphene materials shown by images 400A, 400B, 500A, 500B, 600A, and 600B may include particulate carbon with improved physical properties (e.g., electrical conductivity) compared to 2D graphene materials.

In some implementations, various surface features (e.g., porosity, surface area per unit volume, etc.) may be of similar dimensions as shown in FIGS. 4A-4B, 5A-5B, and 6A-6B. In this way, particular types of the 3D graphene shown in FIGS. 4A-4B, 5A-5B, and 6A-6B may be selected to produce expected signal responses upon exposure to corresponding analytes. In this way, BioFETs (e.g., the BioFET 100 of FIG. 1) may be prepared to detect particular intended analytes (e.g., TNT) by unique combinations of 3D graphene, such as any of those shown in FIGS. 4A-4B, 5A-5B, and 6A-6B. In one or more particular examples, surface roughness of the 3D graphene depicted in FIGS. 4A-4B, 5A-5B, and 6A-6B may range from 50 to 200 nm. The surface structure, shape and/or orientation (collectively referred to as "structure") of depicted 3D graphene may, for example, improve transport of analytes to exposed surfaces on the 3D graphene (e.g., such that the 3D graphene may serve as the molecular recognition elements 144 of the BioFET 100 of FIG. 1). In this way, the structure of the depicted 3D graphene may result in faster diffusion-molecular recognition time, and thereby higher sensitivity to particular corresponding analytes.

In addition, some of the depicted 3D graphene may have randomly distributed ridges and valleys that may increase the molecular residence time and, as a result, affect the molecular recognition process. In addition, exposed surfaces of the 3D graphene depicted in FIGS. 4A-4B, 5A-5B, and 6A-6B may provide biofunctionalization sites for receptor molecules (e.g., those discussed in the process 300 of FIG. 3) may be located between the individual immediately adjacent graphene nanosheets. In this way, electrically charged analyte binding events may occur within the Debye length of immediately adjacent graphene nanosheets, thereby affecting the electrical properties of the 3D graphene channel (e.g., the graphene layer 130 of the BioFET 100 of FIG. 1) to, as a result, enhance biosensor sensitivity even within a high ionic strength liquid environment (e.g., 100-200 millimolar (mM) ionic concentration levels).

The 3D graphene depicted in FIGS. 4A-4B, 5A-5B, and 6A-6B may be used in the various biosensors (e.g., the BioFET 100 of FIG. 1 and/or the array 200 of FIG. 2) and produced using microwave plasma reactors and methods, such as any appropriate microwave reactor and/or method described in U.S. Pat. No. 9,812,295, entitled "Microwave Chemical Processing," or in U.S. Pat. No. 9,767,992, entitled "Microwave Chemical Processing Reactor," which are assigned to the assignee of the present application, and are incorporated by reference in this patent application in their respective entireties. In addition, the 3D graphene described herein may be produced using thermal cracking apparatuses and methods, such as any appropriate thermal apparatus and/or method described in U.S. Pat. No. 9,862,602, entitled "Cracking of a Process Gas," which is assigned to the same assignee as the present application, and is incorporated by reference in this patent application in its respective entireties. In some aspects, the 3D graphene used in the various biosensors disclosed in the present application may include more than one type of carbon allotrope. In one or more particular examples, the 3D graphene may include graphene, spherical fullerenes, carbon nanotubes, amorphous carbon, and/or other carbon allotropes in various forms, quantities, proportions, orientations, placements and so on.

The 3D graphene depicted in FIGS. 4A-4B, 5A-5B, and 6A-6B and used in the graphene layer 130 of the BioFET 100 of FIG. 1 and/or the array 200 of FIG. 2 are also described in U.S. Pat. No. 9,997,334, entitled "Seedless Particles with Carbon Allotropes," which is assigned to the same assignee as the present application, and is incorporated by reference in this patent application in its respective entirety. In some implementations, the 3D graphene may include carbon aggregates, where each carbon aggregate includes carbon nanoparticles. In some aspects, each carbon nanoparticle may include graphene and/or multi-walled spherical fullerenes (MWSFs) and may be synthesized in a reaction chamber or vessel without seed particles (e.g., alternatively referred to as "nucleation particles").

In some implementations, graphene in the 3D graphene may have up to 15 graphene layers. In addition, a ratio, such as percentage, of carbon to other elements, except hydrogen, in the carbon aggregates may be greater than 99%. In some aspects, median sizes of the carbon aggregates may range from 1 mm to 50 mm, or from 50 nm to 50 mm. In some implementations, a surface area of the carbon aggregates may be at least 10 $m^2/g$, or at least 50 $m^2/g$, or from 10 $m^2/g$ to 300 $m^2/g$ or from 200 $m^2/g$ to 1500 $m^2/g$, when measured using a Brunauer-Emmett-Teller (BET) method with nitrogen as the adsorbate. In addition, the 3D graphene when compressed, may have an electrical conductivity greater than 500 S/m, or greater than 5,000 S/m, or from 500 S/m to 12,000 S/m.

The 3D graphene structures disclosed herein may have a relatively high compositional purity (e.g., defined as having <1 wt. % impurities), a relatively high electrical conductivity (e.g., defined as having an electrical conductivity greater than 500 S/m), and a relatively high surface area (e.g., defined as having a surface area greater than 200 $m^2/g$) compared to 2D graphene materials. The relatively high surface area may provide a correspondingly large concentration of analyte sensing sites (e.g., bonding sites for bioreceptors, such as the molecular recognition element 144 of FIG. 1, used to detect target species), which improves the lower detection limit of the BioFET 100. In some implementations, the molecular recognition element 144 associated with the graphene layer 130 may include and/or be composed of bioreceptor molecules, such as a single domain antibody, also referred to as a nanobody. In addition, or the alternative, bioreceptor molecules may include or be composed of one or more short-chain peptides, each short-chain peptide having a particular sequence. In this way, certain enumerated target analytes may bind to, for example, the molecular recognition elements 144 and/or the graphene layer 130, any of which may be composed of the 3D graphene shown in FIGS. 4A-4B, 5A-5B, and 6A-6B. In one or more particular examples, the nature of the binding between the target analytes and the molecular recognition elements 144 may depend on biofunctionalization of the molecular recognition elements 144 with bioreceptor molecules, which may include but are not limited to proteins, enzymes, antibodies, nucleic acids, or a low molecular weight organic compounds.

In some implementations, the 3D graphene may be dispersed in a solution (e.g., NMP) via an ultrasonication process. Further, 3D graphene may be deposited onto the insulating layer 110 of the BioFET 100 of FIG. 1 by methods including spin-coating, inkjet printing, and/or drop casting. By controlling the density and viscosity of the 3D graphene dispersion, the structural and electrical properties of the multilayer 3D graphene structure may also be controlled. In one implementation, the 3D graphene may be deposited over an area larger than is a necessary for an individual BioFET sensor. In this case, the 3D graphene may then be patterned (e.g., as in block 306 of FIG. 3) into individual channels (e.g., as shown by the BioFETs 202 in the array 200 of FIG. 2) for FET biosensors via an oxygen plasma etching method. The patterned 3D graphene may be, in some aspects, electrically connected to a source and drain deposited on the same substrate. The source and drain may be fabricated using a metal evaporation method or via the deposition of conductive inks. A reference electrode (e.g., the gate electrode 150) may be present on the same substrate as the source and drain regions and the 3D graphene channel, and/or may be directly above the channel in a microfluidic or well region structure. Electrode deposition on the 3D graphene substrate may occur before or after the 3D graphene channel growth or deposition.

The carrier mobility of the 3D graphene shown in FIGS. 4A-4B, 5A-5B, and 6A-6B may range between approximately 100 $cm^2/Vs$ and 10,000 $cm^2/Vs$, with a preferred range between 1000 and 5000 $cm^2/Vs$. If a particular voltage bias at the source region is maintained, the voltage applied to the back gate 120 (e.g., shown in FIG. 1) may be swept over a range. The current may be measured simultaneously to measure the transfer characteristics of the BioFET. At a particular gate voltage, the current across the graphene layer 130 will be at a minimum. This gate voltage is known as the Dirac point. Here, the Dirac point of the BioFET 100 may be between approximately 0V and 20 V when measured under dry conditions (e.g., without the electrolyte solution 104 contacting the graphene layer 130). In operational conditions, the gate electrode 150 may be submerged into the electrolyte solution 104 containing the analyte 160 intended for detection. In this way, the gate electrode 150 may be used to apply a gate bias, and the Dirac point may be between 0 and 1 V.

Figure 7:
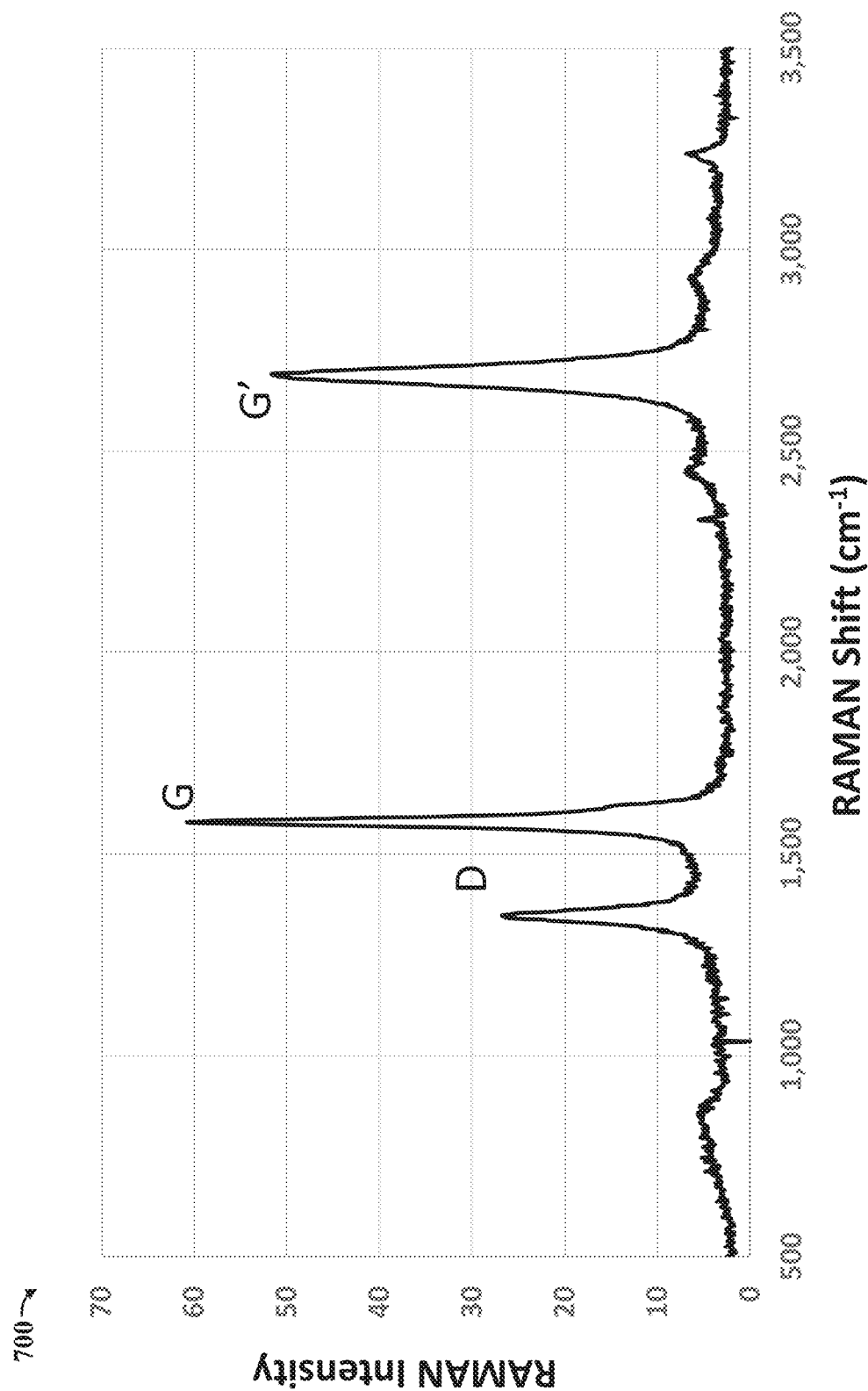
FIG. 7 shows a Raman spectra of an example 3D graphene, according to some implementations.

FIG. 7 shows a Raman spectra 700 of an example 3D graphene, according to some implementations. In some implementations, the Raman spectra 700 may be representative of any of the 3D graphene shown in FIGS. 4A-4B, 5A-5B, and 6A-6B.

Figure 8:
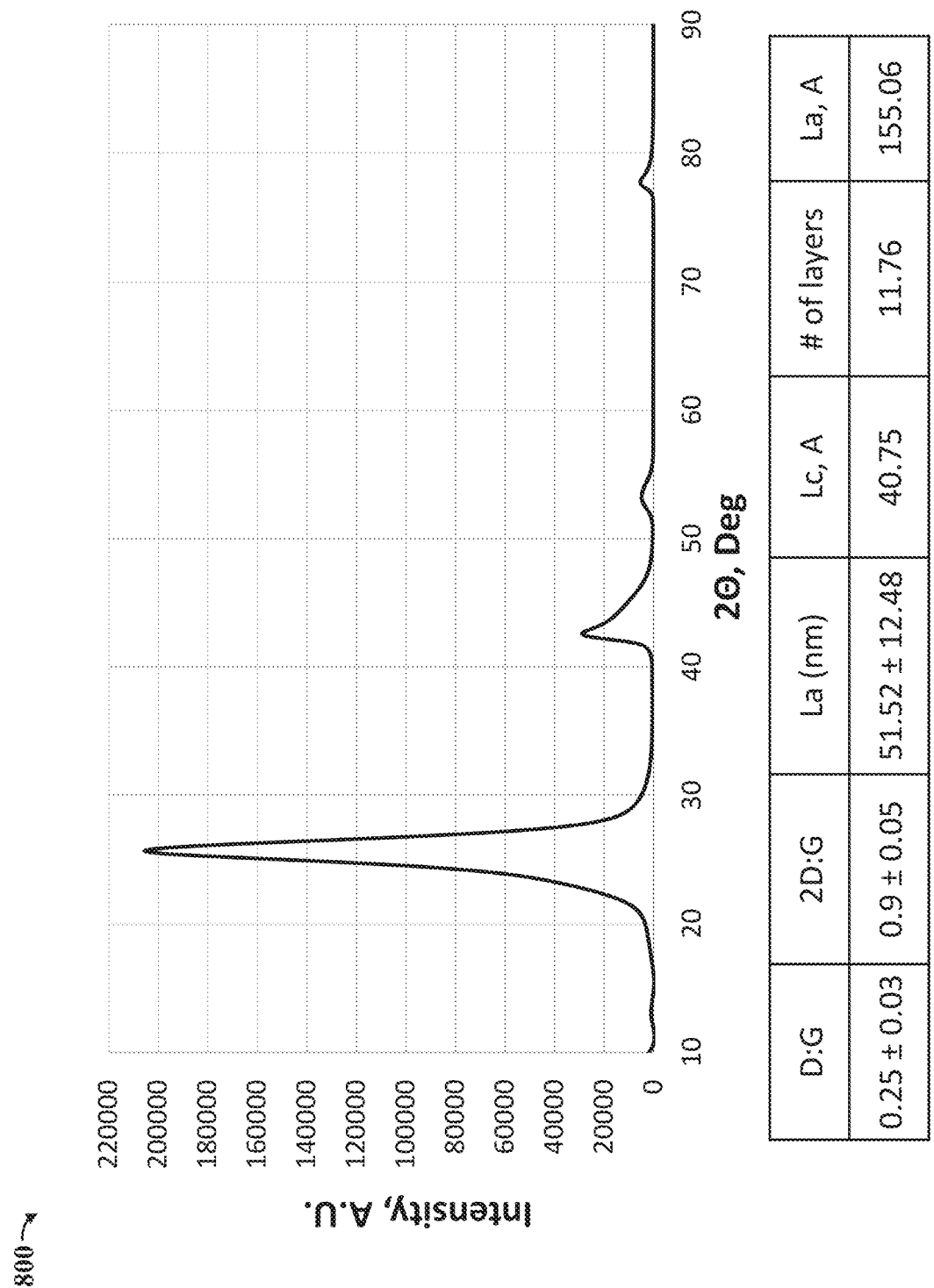
FIG. 8 shows an x-ray diffraction (XRD) analysis result for the example 3D graphene of FIG. 7, according to some implementations.

FIG. 8 shows an x-ray diffraction (XRD) analysis result 800 for the example 3D graphene of FIG. 7, according to some implementations. In some implementations, the graph 800 may be representative of any of the 3D graphene shown in FIGS. 4A-4B, 5A-5B, and 6A-6B.

Figure 9:
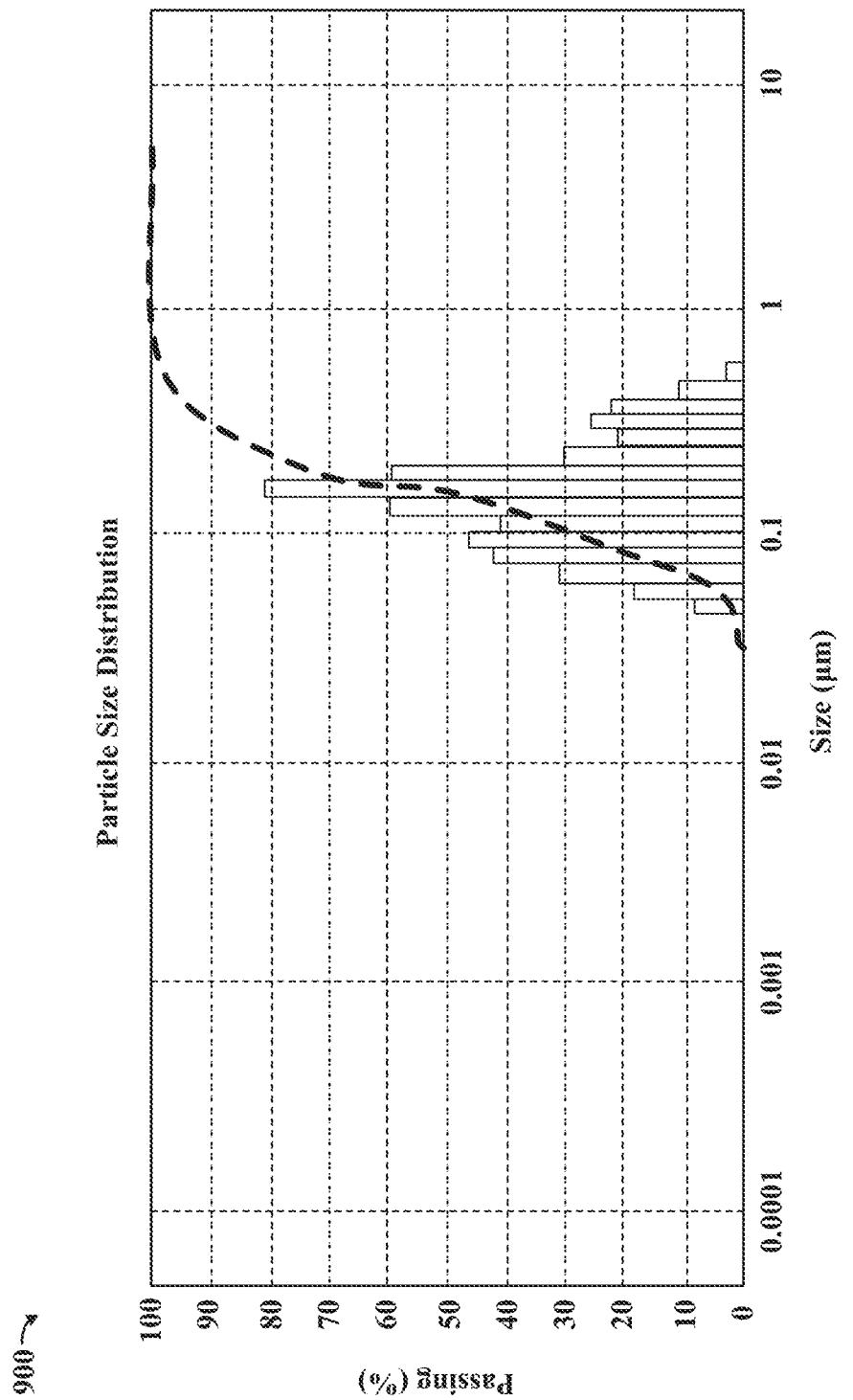
FIG. 9 shows a graph showing particle size distribution for the example 3D graphene of FIG. 7, according to some implementations.

FIG. 9 shows a graph 900 showing particle size distribution for the example 3D graphene of FIG. 7, according to some implementations. In some aspects, the graph 900 is indicative of particles having a volume distribution (MV) was 69.6 nm with a mean diameter of the number distribution (MN) of 85.9 nm and mean diameter of area distribution (MA) of 103.9 nm.

Figure 10:
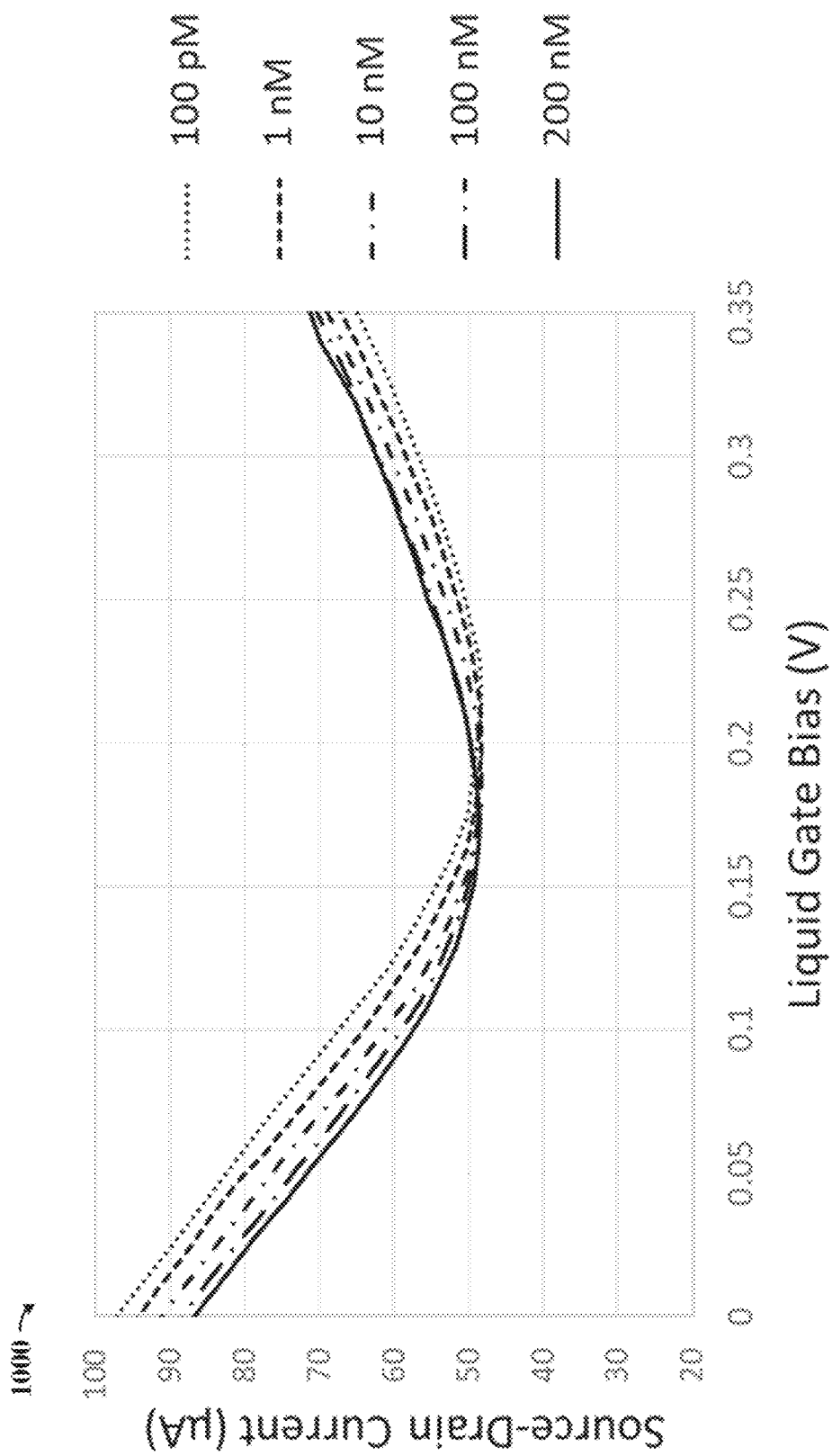
FIG. 10 shows a graph showing transfer curves for the BioFET of FIG. 1, according to some implementations.

FIG. 10 shows a graph 1000 showing transfer curves for the BioFET 100 of FIG. 1, according to some implementations. In an experimental run, a sensor configured similar to the BioFET 100 of FIG. 1 was used to test for the presence of TNT in 100 mM phosphate buffer solution (e.g., 13.7 mM NaCl, 1 mM phosphate, 270 μM KCl; pH 7.4). The 3D graphene used in this example includes the 3D graphene described with reference to FIGS. 4A-4B, 5A-5B, and 6A-6B. The bioreceptor was anti-TNT Peptide Sequence 1. The graph 1000 depicts transfer curves at a gate voltage of $V_g$=0.1 V of the BioFET functionalized with the bioreceptors (e.g., anti-TNT Peptide Sequence 1) to bind with TNT. As solutions with higher concentrations of TNT were introduced to the BioFET, the Dirac voltage of the device corresponding decreased. This relationship may have indicated that the binding of the analyte with the 3D graphene thereby induced a higher electron density within the 3D graphene, either through the intrinsic electron-withdrawing inductive effects of the analyte, or from the charge distribution change in the presented peptide aptamers induced upon analyte binding.

Figure 11:
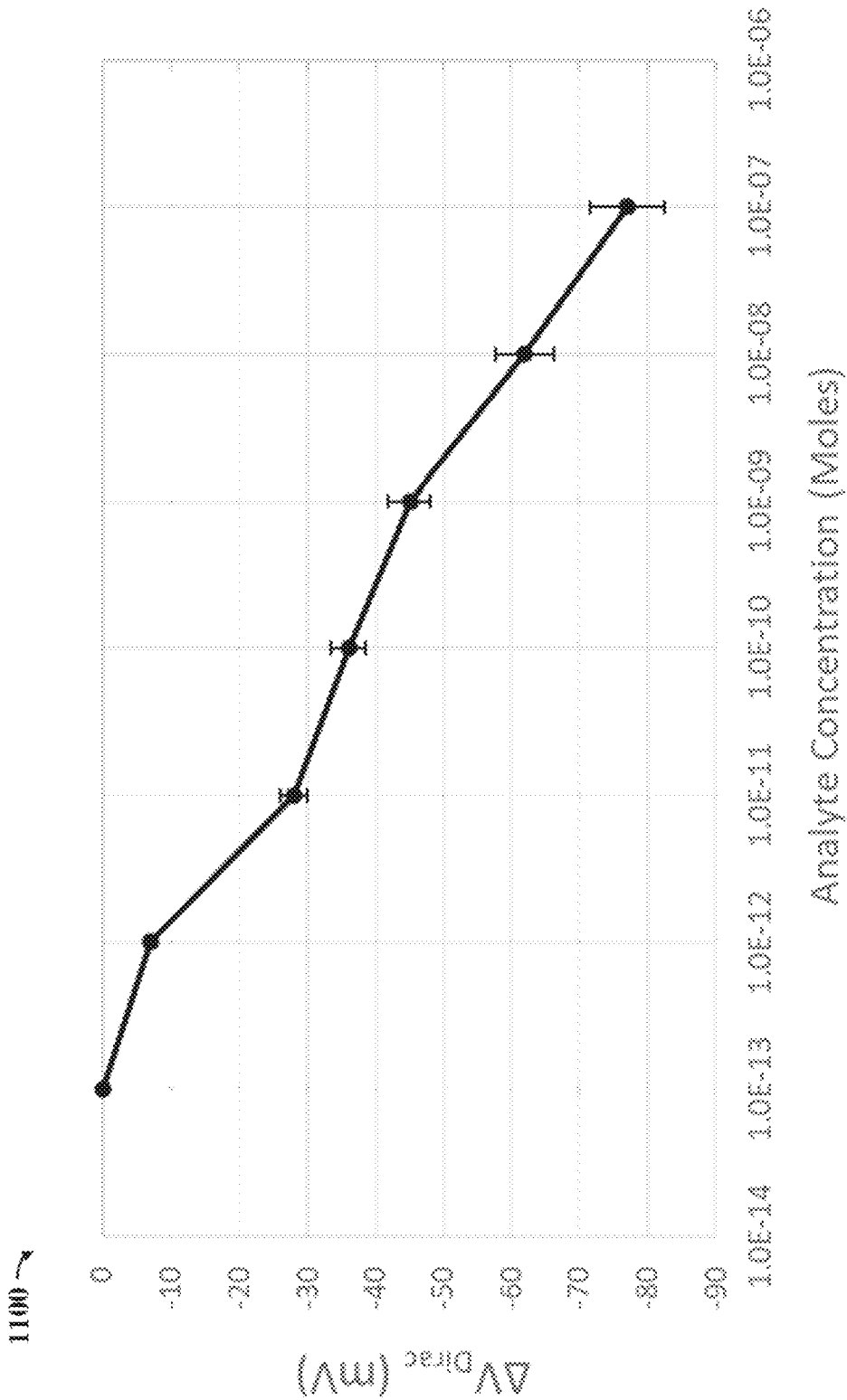
FIG. 11 shows a graph depicting a shift in Dirac voltage detected by the BioFET of FIG. 1, according to some implementations.

FIG. 11 shows a graph 1100 depicting a shift in Dirac voltage detected by the BioFET of FIG. 1, according to some implementations. Shifts in the Dirac voltage were observed after exposure of example BioFETs (e.g., the BioFET 100 and/or the array 200) to a series of TNT solutions with analyte concentrations ranging from 100 pM to 100 nM. Error bars indicate standard deviations from measurements with 5 different devices.

Figure 12:
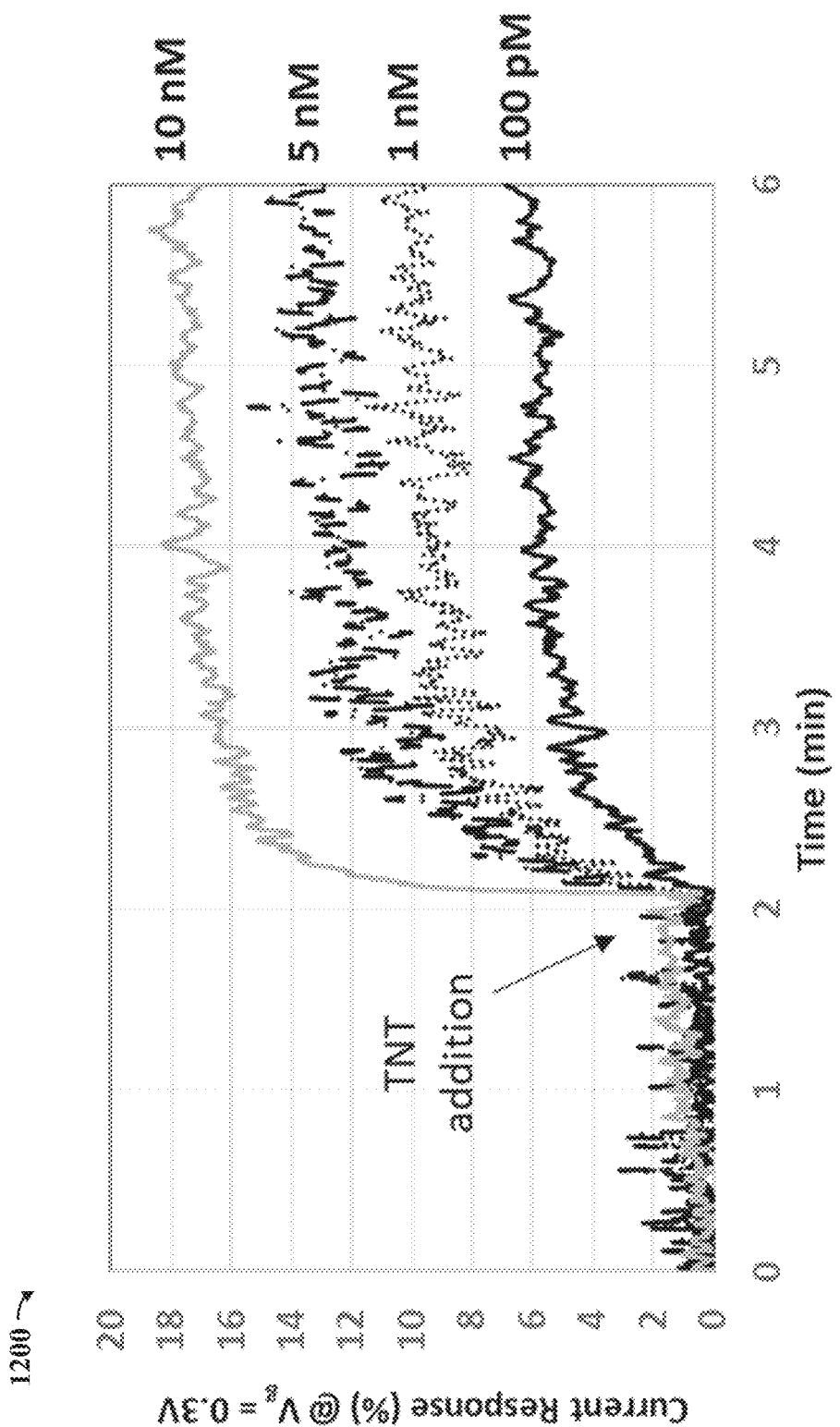
FIG. 12 shows a graph depicting an example real-time response of the BioFET of FIG. 1, according to some other implementations.

FIG. 12 shows a graph 1200 depicting an example real-time response of the BioFET 100 of FIG. 1, according to some other implementations. The response was generated for an anti-TNT peptide aptamer-functionalized GFET operated at $V_g$=0.3 V and $V_{ds}$=0.1 V. The FET sensor is exposed to a series of solutions with analyte concentrations ranging from 100 pM to 10 nM, at the time indicated by the black arrow. As the FET is measured with a gate bias higher than the Dirac voltage, the increase in electron density within the 3D graphene channel due to analyte binding causes an increase in the conductance.

Figure 13:
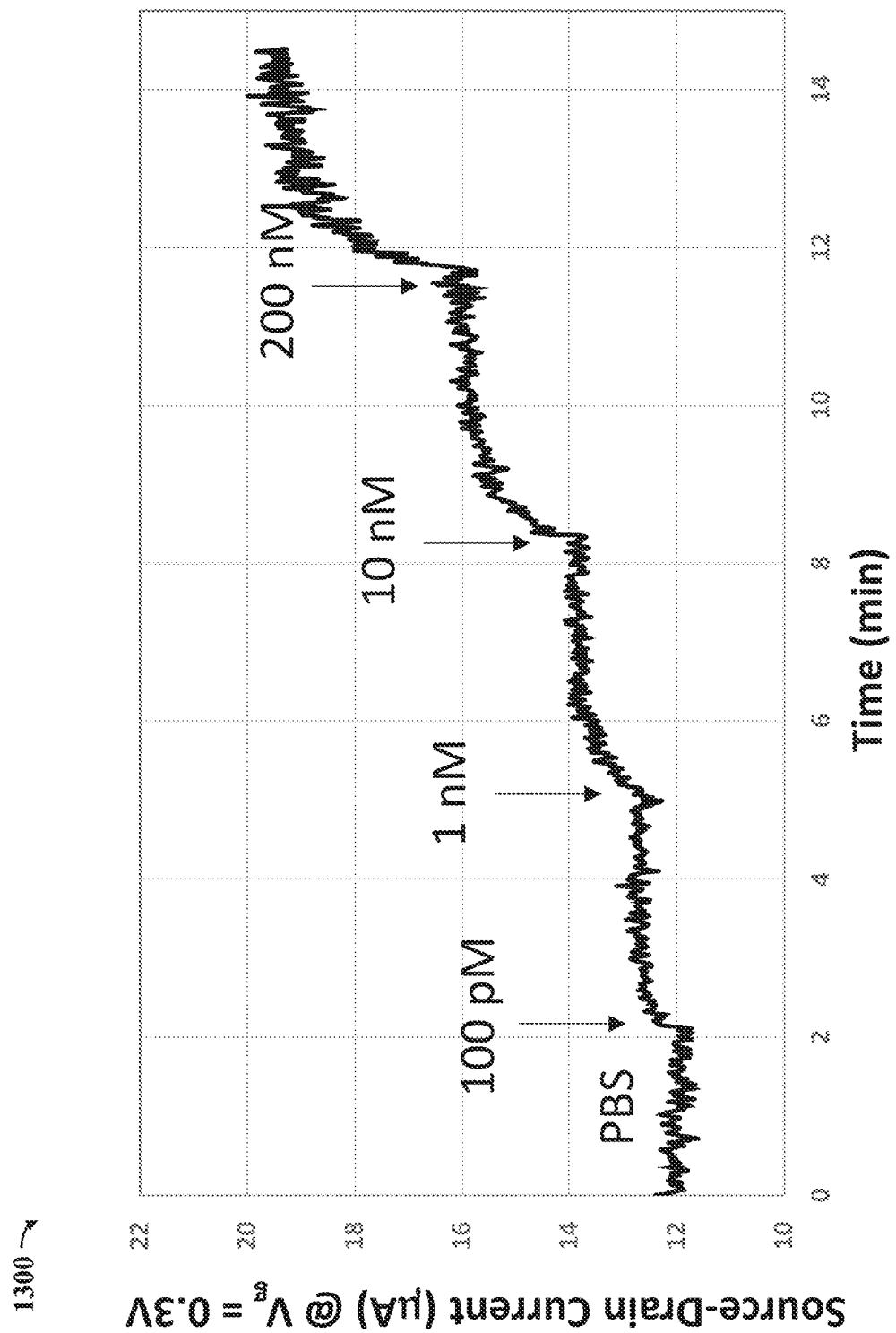
FIG. 13 shows a graph depicting an example real-time response of the BioFET of FIG. 1, according to some other implementations.

FIG. 13 shows a graph 1300 depicting an example real-time response of the BioFET 100 of FIG. 1, according to some other implementations. The real-time response was generated for a peptide aptamer-functionalized GFET operated at Vg=0.3 V and Vds=0.1 V. The BioFET 100 is exposed to a series of solutions with analyte concentrations ranging from 100 pM to 200 nM. Every 2-3 mins, the solution exposed to the 3D graphene is changed. As the BioFET 100 is measured with a gate bias higher than the Dirac voltage, the increase in electron density within the 3D graphene channel due to analyte binding causes an increase in the current. Thus, the 3D graphene-based BioFET demonstrated the ability to detect TNT with high sensitivity in the presence of high background salt concentration.

The 3D graphene-based BioFET can be functionalized with a variety of peptides to detect different analytes in the environment. Mercury (Hg) has been used in a variety of industrial processes for decades but can be extremely toxic to both human health and the environment. Various analytical devices have been developed to detect $Hg^{2+}$ ions, including peptide-functionalized colorimetric and fluorescence sensors. As in the case for TNT, the same peptides can be used as a bioreceptor molecule for the 3D graphene-based BioFET. The amino acid sequence is: $Hg^{2+}$ Peptide Sequence 1: Thr-Thr-Cys-Thr-Thr-Thr-Cys-Thr-Thr-Cys-Cys-Cys-Cys-Thr-Thr-Gly-Thr-Thr-Thr-Gly-Thr-Cys.

The 3D graphene-based BioFETs disclosed herein can be covalently or non-covalently functionalized with this $Hg^{2+}$ peptide using the same techniques described above. Upon exposure to $Hg^{2+}$ ions, amino protons of the thymine (T) groups in the peptide are displaced, forming a thymine-$Hg^{2+}$ ion-thymine (T-$Hg^{2+}$-T) complex. The peptide folds back in on itself at the Cys-Cys-Cys-Cys sequence, allowing the corresponding thymine groups to bind to $Hg^{2+}$ ions, as well as the corresponding cysteine (Cys) and glycine (Gly) groups. The $Hg^{2+}$ ions immobilized between two thymines are reduced from the graphene surface, which accumulates holes as a majority positive charge carrier In an experimental run, a sensor configured similar to FIG. 9 was used to test for the presence of $Hg^{2+}$ ions in 1 M phosphate buffer solution (137 mM NaCl, 10 mM phosphate, 2.7 mM KCl; pH 7.4). The 3D graphene was in this example the particular carbon described herein. A sensor which utilized 2D graphene grown using a chemical vapor deposition (CVD) method and transferred to a Si:$SiO_2$ substrate with patterned electrodes via lamination was configured in the same manner and also tested. The bioreceptor was $Hg^{2+}$ Peptide Sequence 1.

Figure 14A:
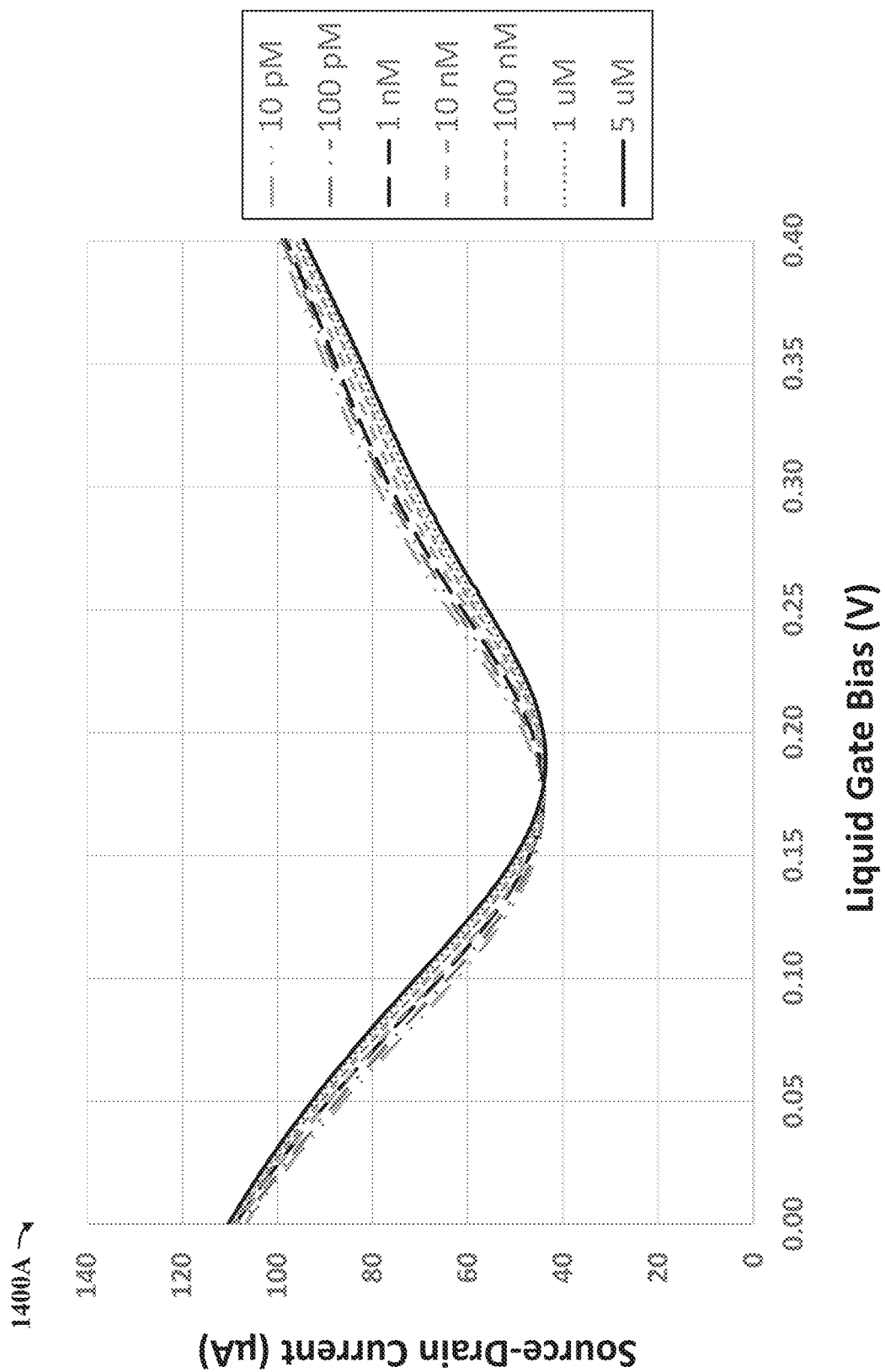
FIG. 14A shows a graph depicting transfer curves of a two-dimensional graphene-based BioFET, according to some implementations.

FIG. 14A shows a graph 1400A depicting transfer curves of a two-dimensional graphene-based BioFET, according to some implementations. The transfer curves were generated for a 2D graphene FET device functionalized with the bioreceptors at different concentrations of $Hg^{2+}$ and operated with a gate voltage ($V_g$=0.1 V). As solutions with higher concentrations are introduced, the Dirac voltage increased, as the binding of this analyte induces a higher hole density within the channel.

Figure 14B:
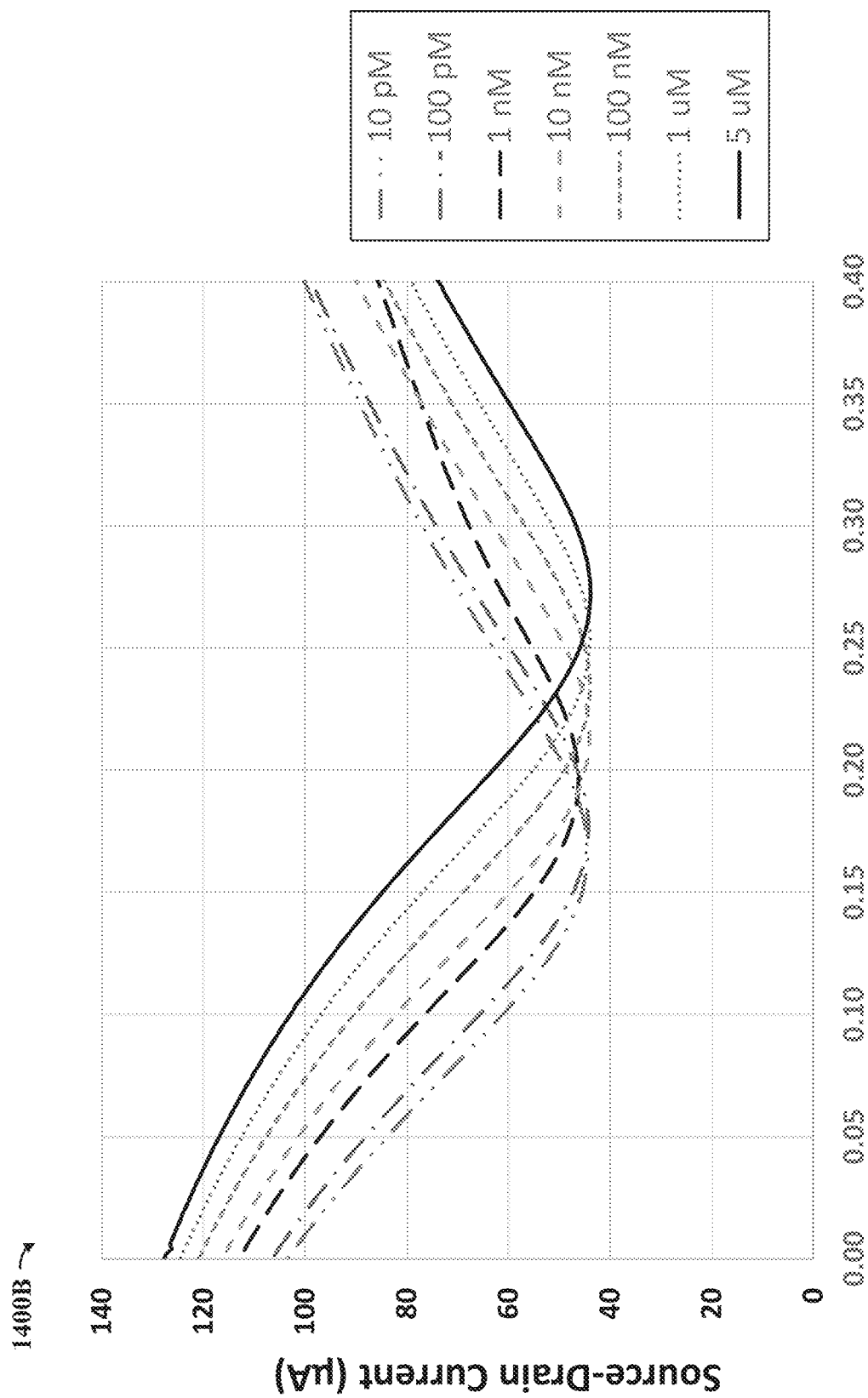
FIG. 14B shows a graph depicting transfer curves of the BioFET of FIG. 1, according to other implementations.

FIG. 14B shows a graph 1400B depicting transfer curves of the BioFET of FIG. 1, according to other implementations. The transfer curves were generated for a 3D graphene-based BioFET functionalized with the same bioreceptor and exposed to the same concentrations of $Hg^{2+}$ ions (e.g., in an aqueous solution) operated at a gate voltage of $V_g$=0.1 V. The Dirac voltage again increases with analyte concentration, but the shift is much larger due to the increase in Debye length of the 3D graphene-based BioFET. Less of the $Hg^{2+}$ ionic charge is screened due to counterions in the solution, thereby inducing a higher hole density within the 3D graphene channel and causing a correspondingly higher shift in Dirac voltage.

Figure 15:
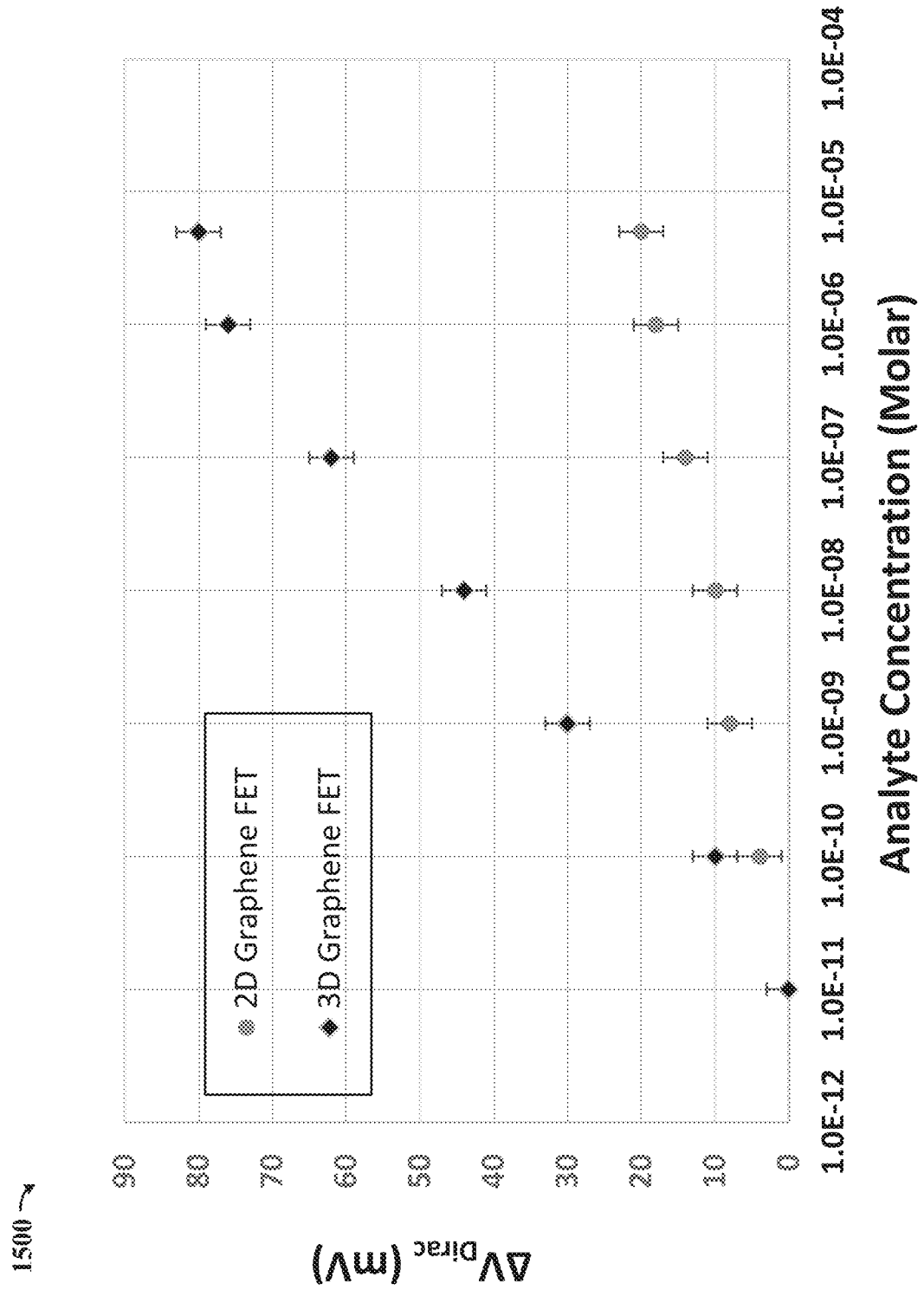
FIG. 15 shows a graph depicting a shift in Dirac voltage detected by the BioFET of FIG. 1, according to other implementations.

FIG. 15 shows a graph 1500 depicting a shift in the Dirac voltage detected by the BioFET 100 of FIG. 1, according to other implementations. Specifically, the graph 1500 compares the shift in the Dirac voltage for the 2D graphene FET devices and the 3D graphene-based BioFETs after exposure to a series of $Hg^{2+}$ solutions with concentrations ranging from 10 pM to 5 µM. Error bars indicate standard deviations from measurements with 5 different devices. Note the signal enhancement obtained when using a 3D graphene structure.

Figure 16A:
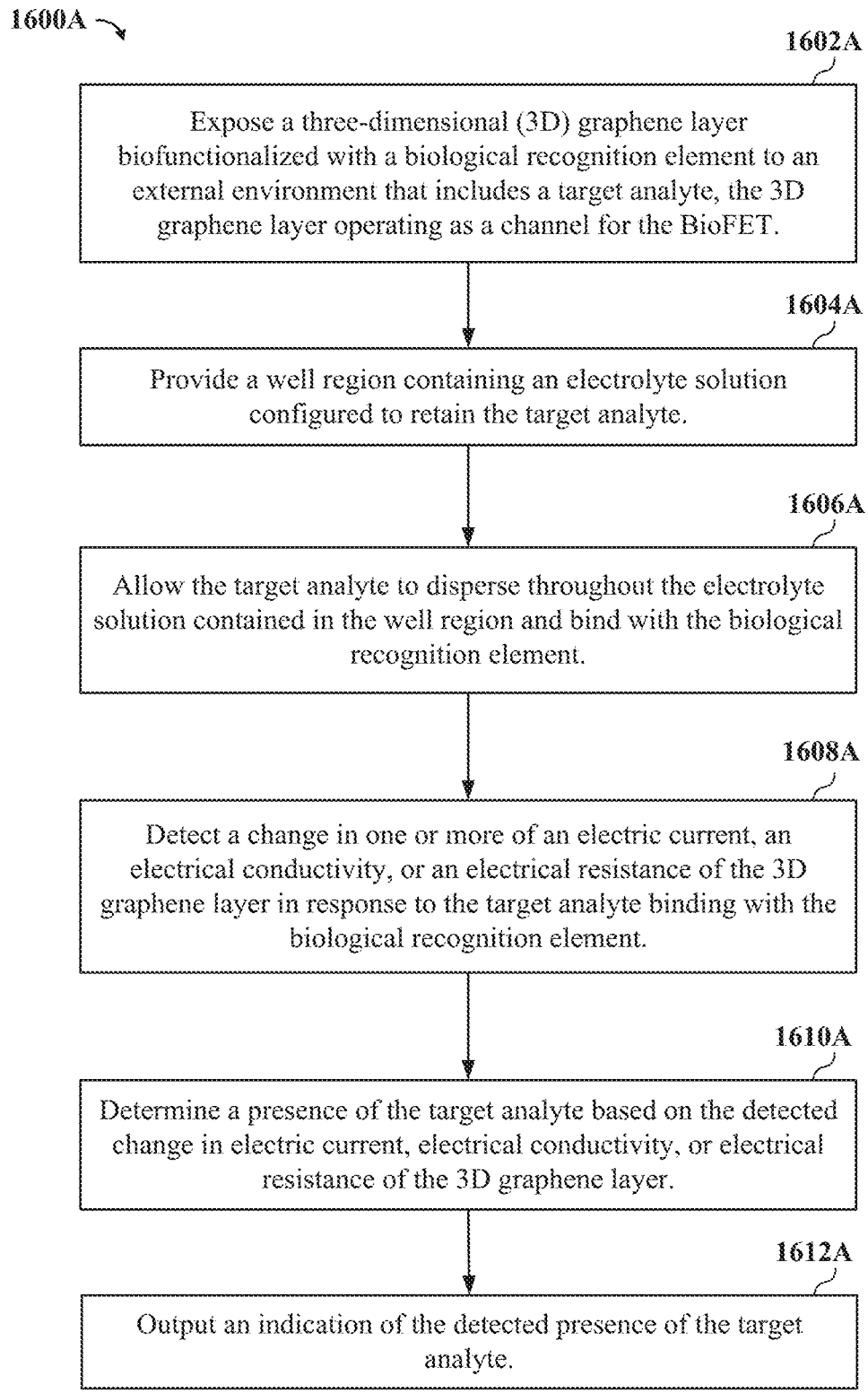

FIG. 16A shows a flowchart depicting an example operation 1600A for detecting analytes, according to some implementations. In various implementations, the operation 1600A may be performed by a BioFET such as (but not limited to) the BioFET 100 of FIG. 1 or the array 200 of FIG. 2. In other implementations, the operation 1600A may be performed by another suitable BioFET. In some implementations, the operation 1600A may be used to detect minute levels of a target analyte, for example, as described with reference to one or more of FIG. 1-15. In some aspects, the operation 1600A begins in block 1602A by exposing a three-dimensional (3D) graphene layer biofunctionalized with a biological recognition element to an external environment that includes a target analyte, the 3D graphene layer operating as a channel for the BioFET. The operation 1600A continues at block 1604A with providing a well region containing an electrolyte solution configured to retain the target analyte. The operation 1600A continues at block 1606A with allowing the target analyte to disperse throughout the electrolyte solution contained in the well region and bind with the biological recognition element. The operation 1600A continues at block 1608A with detecting a change in one or more of an electric current, an electrical conductivity, or an electrical resistance of the 3D graphene layer in response to the target analyte binding with the biological recognition element. The operation 1600A continues at block 1610A with detecting binding of the biological recognition element to the target analyte based on the change.

The operation 1600A continues at block 1612A with outputting an indication of the detected presence of the target analyte.

In various implementations, the target analyte may be 2,4,6-Trinitrotoluene, "TNT" at physiologically relevant conditions (e.g., 100-200 millimolar (mM) ionic concentration levels. In some implementations, the BioFET 100 of FIG. 1 may be used to detect the analyte by performing the operation 1600A of FIG. 16A. In addition, or in the alternative, the array 200 of FIG. 2 may be used to detect the analyte by performing the operation 1600A of FIG. 16A. In various implementations, the analyte detected by performance of the operation 1600A may be or include various molecules.

Figure 16B:
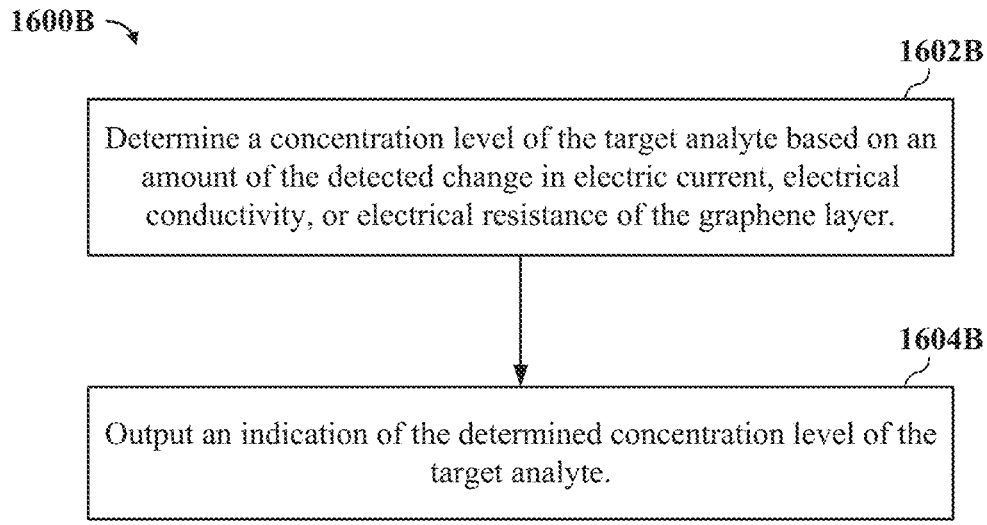

FIG. 16B shows a flowchart depicting an example operation 1600B for detecting analytes, according to some implementations. In various implementations, the operation 1600B may be performed after determining the change in electric current or conductivity of the graphene layer in block 1606A of FIG. 16A. For example, the operation 1600B begins at block 1602B with determining a concentration level of the target analyte based on an amount of the detected change in electric current, electrical conductivity, or electrical resistance of the 3D graphene layer. The operation 1600B continues at block 1604B with outputting an indication of the determined concentration level of the target analyte.

Figure 16C:
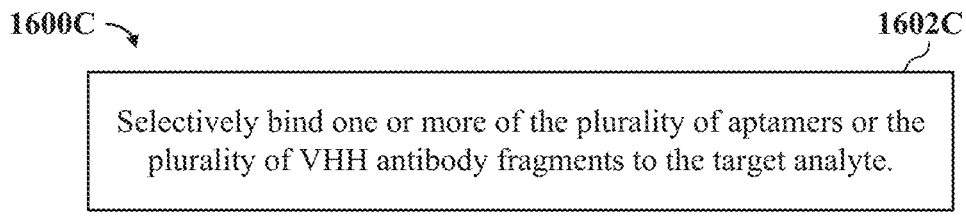

FIG. 16C shows a flowchart depicting an example operation 1600C for selectively binding a target analyte, according to some implementations. In various implementations the operation 1600C may be performed after producing a biofunctionalized carbonaceous material in block 1604B of FIG. 16B. For example, the operation 1600C begins at block 1602C with selectively binding one or more of the plurality of aptamers or the plurality of VHH antibody fragments to the target analyte.

Figure 16D:
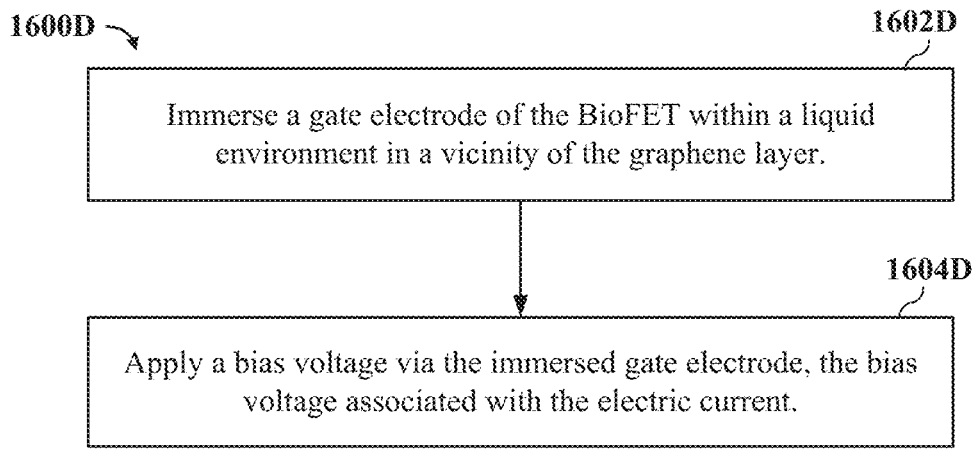

FIG. 16D shows a flowchart depicting an example operation 1600D for applying a bias voltage to a BioFET, according to some implementations. In various implementations, the operation 1600D may be performed before or concurrently with exposing the graphene layer to the external environment in block 1602A of FIG. 16A. For example, the operation 1600D begins at block 1602D with immersing a gate electrode of the BioFET within a liquid environment in a vicinity of the graphene layer. The operation 1600D continues at block 1604D with applying a bias voltage via the immersed gate electrode, the bias voltage associated with the electric current.

FIG. 16E shows a flowchart depicting an example operation 1600E for determining the target analyte, according to some implementations. In various implementations, the operation 1600E may be performed after applying the bias voltage to the BioFET in block 1604D of FIG. 16D. For example, the operation 1600E begins at block 1602E with determining one or more of a presence, an absence, or a concentration of the target analyte based on the change in electrical current in block 1606A of FIG. 16A.

FIG. 16F shows a flowchart depicting an example operation 1600F for detecting change in electric current within a vicinity of the graphene layer of a BioFET, according to some implementations. In various implementations, the operation 1600F may be performed after applying the bias voltage to the BioFET in block 1604D of FIG. 16D. For example, the operation 1600F begins at block 1602F with detecting a change in the electric current at a particular bias voltage applied by the immersed gate electrode.

FIG. 16G shows a flowchart depicting an example operation 1600G for defining a region of operation of a BioFET, according to some implementations. In various implementations, the operation 1600G may be performed after applying the bias voltage to the BioFET in block 1604D of FIG. 16D. For example, the operation 1600G begins at block 1602G with defining a region of operation for the BioFET based on the target analyte.

FIG. 16H shows a flowchart depicting an example operation 1600H for detecting a target analyte, according to some implementations. In various implementations, the operation 1600H may be performed after or concurrently during outputting the molecule concentration level indication of block 1610A of FIG. 16A. For example, the operation 1600H begins at block 1602H with detecting the target analyte in a liquid environment having an ionic salt concentration exceeding 100 millimolar (mM).

FIG. 16I shows a flowchart depicting an example operation 1600I for blocking fluid communication, according to some implementations. In various implementations, the operation 1600I may be performed concurrently during or after applying the bias voltage from the immersed gate electrode in block 1604D of FIG. 16D. For example, the operation 1600I begins at block 1602I with blocking fluid communication between the external environment and each of the source and drain regions of the BioFET. In some aspects, the passivation layer may include a first portion $114_1$ and a second portion $114_2$ as described with reference to the BioFET 100 of FIG. 1. In various implementations, blocking fluid communication as performed at block 1602I may improve performance of the BioFET 100 of FIG. 1 and/or the array 200 of FIG. 2 by preventing unwanted contaminants from entering the graphene layer of the BioFET.

Figure 16J:
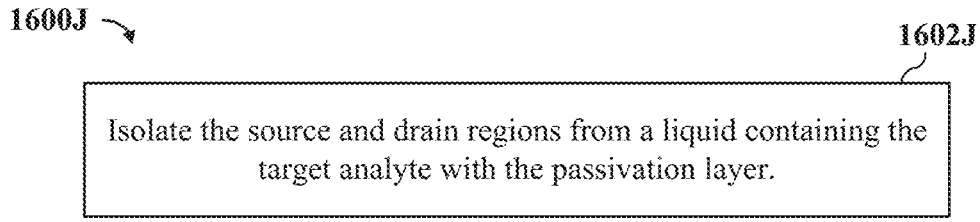

FIG. 16J shows a flowchart depicting an example operation 1600J for isolating the source and drain regions, according to some implementations. In various implementations, the operation 1600J may be performed concurrently with blocking the fluid communication as described with reference to block 1602I. For example, the operation 1600J begins at block 1602J with isolating the source and drain regions from a liquid containing the target analyte with the passivation layer. In various implementations, isolation of the source and drain regions may protect the source and drain regions from physical damage or exposure to the electrolyte solution 104.

Figure 16K:
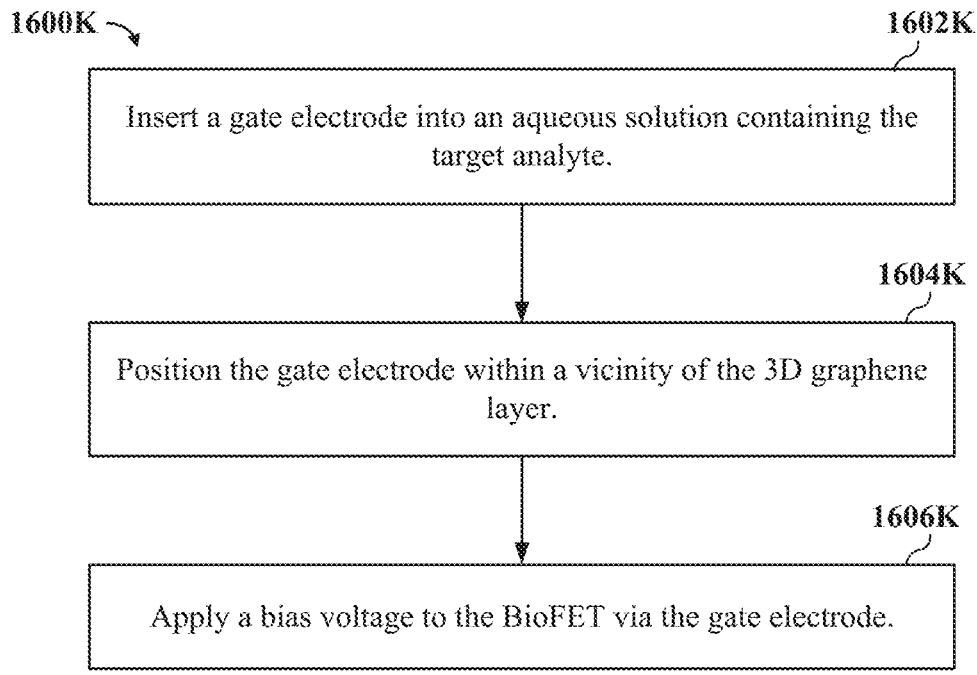

FIG. 16K shows a flowchart depicting an example operation 1600K for applying a bias voltage to the BioFET via the gate electrode, according to some implementations. In various implementations, the operation 1600K may be performed instead of the operation 1600D of FIG. 16D. For example, the operation 1600K begins at block 1602K with inserting a gate electrode into an aqueous solution containing the target analyte. The operation 1600K continues at block 1604K with positioning the gate electrode within a vicinity of the graphene layer of the BioFET. The operation 1600K continues at block 1606K with applying a bias voltage to the BioFET via the gate electrode, where the bias voltage is associated with the change in electric current of the BioFET resulting from exposure to the analyte.

Figure 16L:
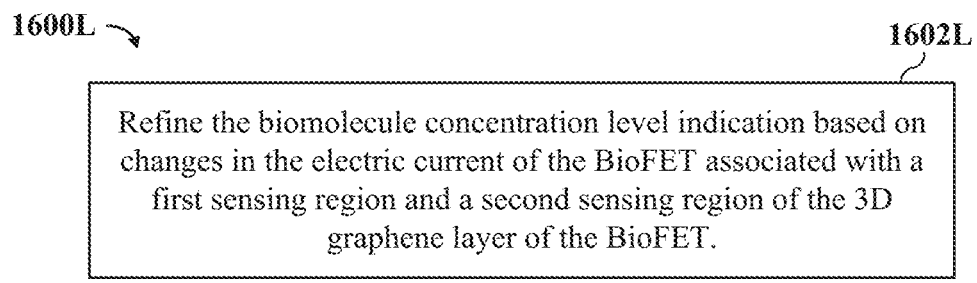

FIG. 16L shows a flowchart depicting an example operation 1600L for refining the molecule concentration level indication of block 1610A of FIG. 16A, according to some implementations. In various implementations, the operation 1600L may be performed concurrently with or after the block 1610A of FIG. 16A. For example, the operation 1600L begins at block 1602L with refining the molecule concentration level indication based on changes of the electric current of the BioFET associated with a first sensing region and a second sensing region of the 3D graphene layer of the BioFET.

Figure 16M:
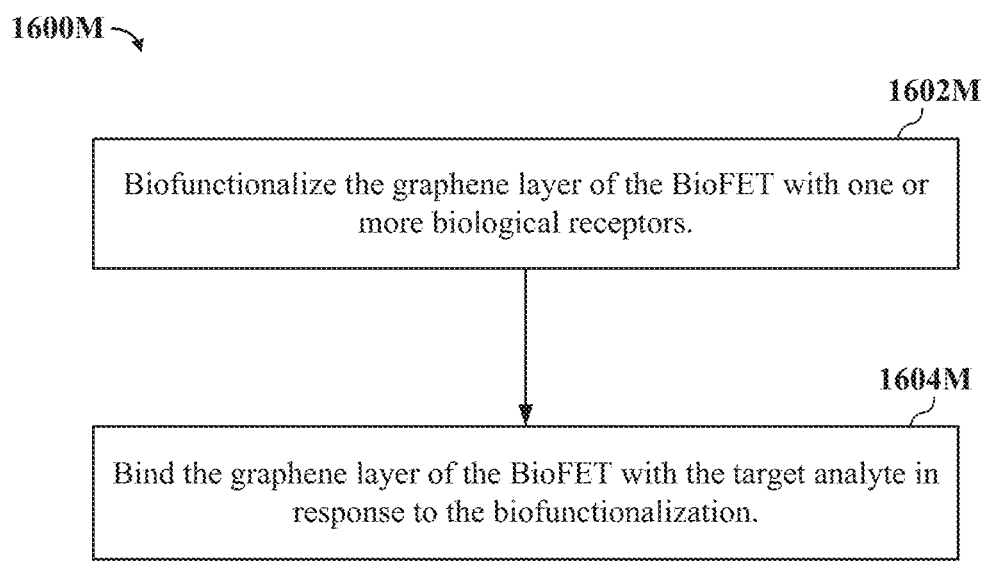

FIG. 16M shows a flowchart depicting an example operation 1600M for biofunctionalizing the 3D graphene layer of the BioFET, according to some implementations. In various implementations, the operation 1600M may be performed before exposing the 3D graphene layer to the external environment including the target analyte in block 1602A of FIG. 16A. In addition, or the alternative, the operation 1600B may replace the biofunctionalization of the exposed surfaces of the 3D graphene layer with biological receptors in block 1602B of FIG. 16B. For example, the operation 1600M begins at block 1602M with biofunctionalizing the 3D graphene layer of the BioFET with one or more biological receptors. The operation 1600M continues at block 1604M with binding the 3D graphene layer of the BioFET with the target analyte in response to the biofunctionalization.

Figure 17A:
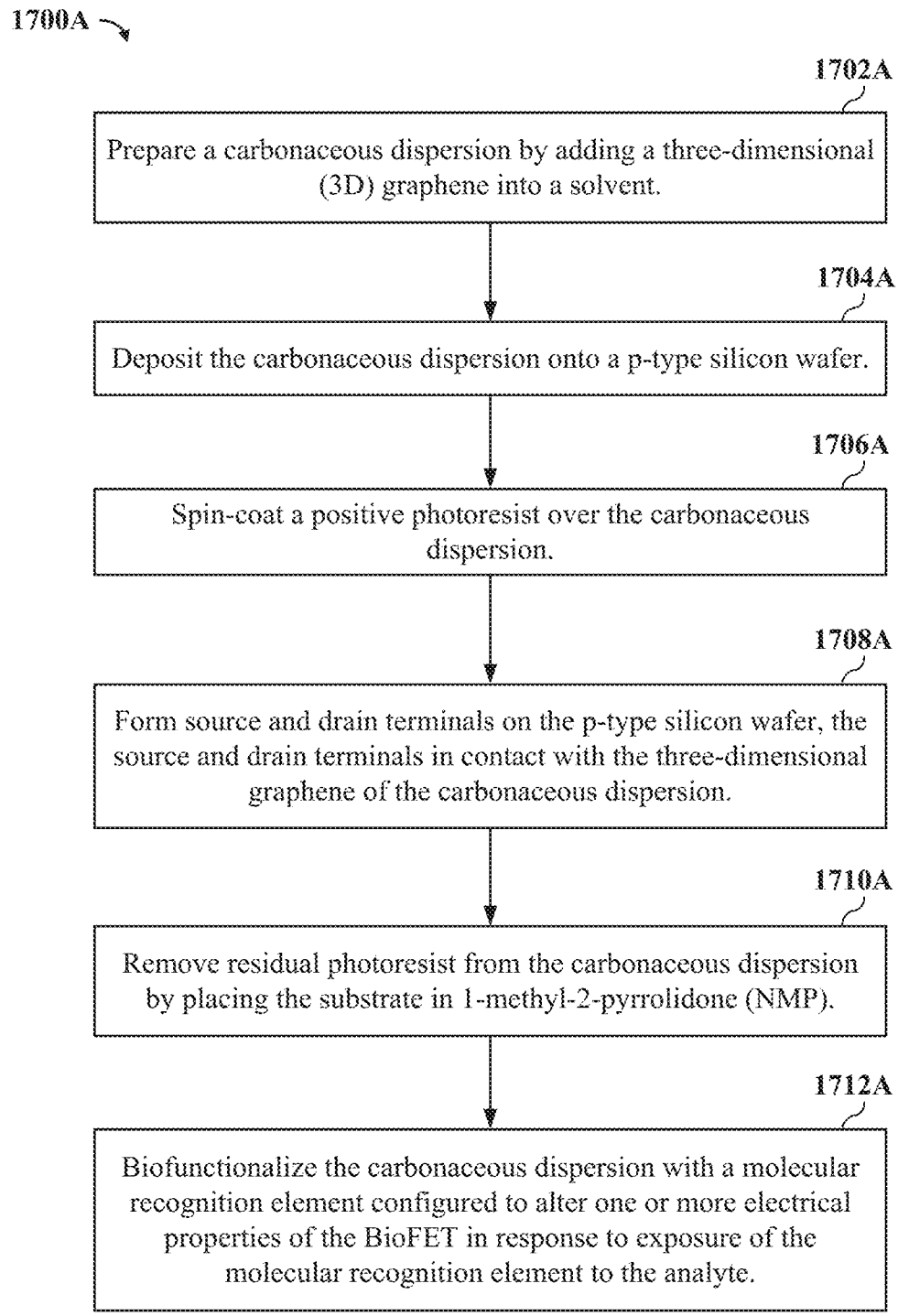
FIGS. 17A-17V show flowcharts depicting example operations for manufacturing the BioFET of FIG. 1, according to some implementations.

FIG. 17A shows a flowchart depicting an example operation 1700A for manufacturing a BioFET such as (but not limited to) the BioFET 100 of FIG. 1 and/or the array 200 of FIG. 2. In some implementations, the operation 1700A may be used manufacture a BioFET that can detect minute levels of a target analyte, for example, as described with reference to one or more of FIGS. 1-15. In some aspects, the operation 1700A begins in block 1702A with preparing a carbonaceous dispersion by adding a 3D graphene (e.g., similar to the graphene layer 130 of FIG. 1) into a solvent. The operation 1700A continues in block 1704A with depositing the carbonaceous dispersion onto a p-type silicon wafer. The operation 1700A continues in block 1706A with spin-coating a positive photoresist over the carbonaceous dispersion. The operation 1700A continues in block 1708A with forming source and drain terminals on the p-type silicon wafer, the source and drain terminals in contact with the three-dimensional graphene of the carbonaceous dispersion. The operation 1700A continues in block 1710A with removing the residual photoresist from the carbonaceous dispersion by placing the substrate in 1-methyl-2-pyrrolidone (NMP). The operation 1700A continues in block 1712A with biofunctionalizing the carbonaceous dispersion with a molecular recognition element configured to alter one or more electrical properties of the BioFET in response to exposure of the molecular recognition element to the analyte.

Figure 17B:
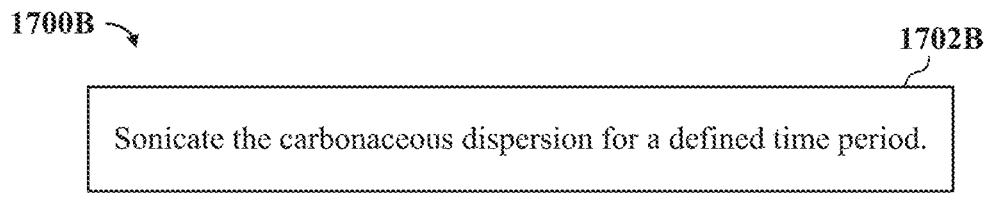

FIG. 17B shows a flowchart depicting an example operation 1700B for sonicating the carbonaceous dispersion, according to some implementations. In various implementations, the operation 1700B may be performed during preparation of the carbonaceous dispersion in block 1702A of FIG. 1700A. In some aspects, the operation 1700B begins in block 1702B with sonicating the carbonaceous dispersion for a defined time period (e.g., 30 minutes).

Figure 17C:
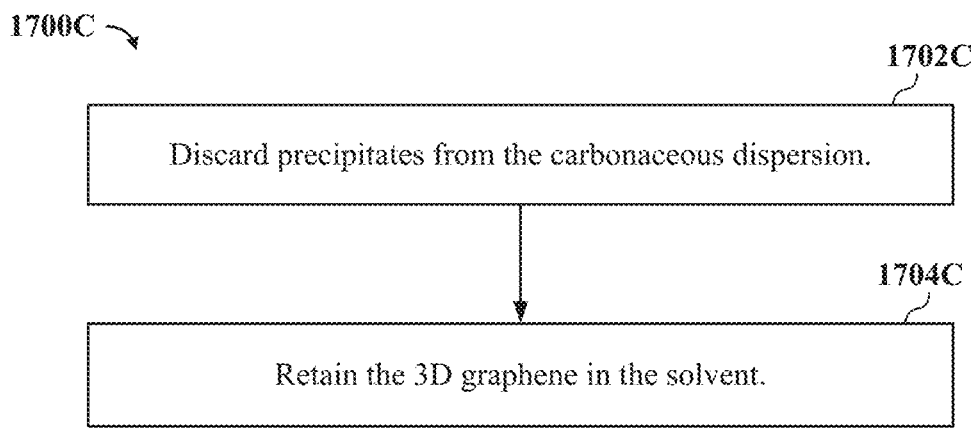

FIG. 17C shows a flowchart depicting an example operation 1700C for purifying the carbonaceous dispersion that was sonicated in block 1702A of FIG. 17A, according to some implementations. In various implementations, the operation 1700C may be performed after preparing the carbonaceous dispersion by adding the 3D graphene into the solvent described with reference to block 1702A of FIG. 17A. In some aspects, the operation 1700C begins in block 1702C with discarding precipitates from the carbonaceous dispersion. The operation 1700C continues in block 1704C with retaining the 3D graphene in the solvent.

In various implementations, purification of the carbonaceous dispersion may improve the binding ability of the 3D graphene layer with, for example, nanobodies and/or antibodies as associated with the detection of analytes, as discussed above. For example, unwanted aggregates of carbonaceous materials may be separated and/or discarded at block 1702, leaving behind only pristine 3D graphene grown as a monolith. In this way, the pristine 3D graphene may provide an improved surface area to volume ratio (as compared to conventional BioFETs) without suffering impediments resulting from impurities residing on exposed carbonaceous surfaces of the pristine 3D graphene. As a result, the pristine 3D graphene disclosed herein may provide more binding sites to bind with nanobodies (as compared to 2D graphene materials).

Figure 17D:
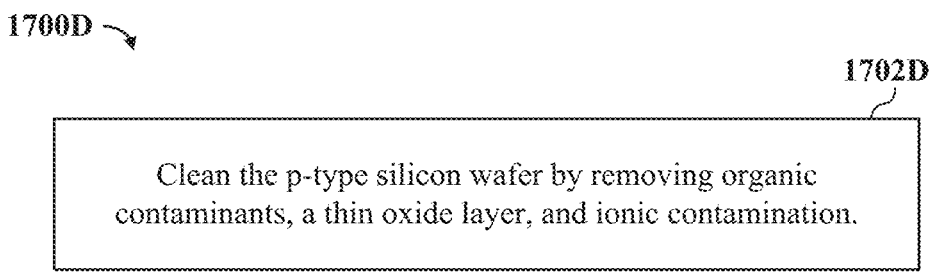

FIG. 17D shows a flowchart depicting an example operation 1700D for cleaning the silicon wafer, according to some implementations. In some aspects, the operation 1700D begins in block 1702D with cleaning the p-type silicon wafer by removing organic contaminants, oxide layers, and ionic contamination. In some implementations, the cleaning may include the removal of contamination that can be encountered during semiconductor device manufacturing. The contamination can have a detrimental impact on yield, reliability, and process control. Contamination control, as a result, may consider various aspects of cleaning methods and materials including chemicals, concentrations, chemical reactions, process sequences, and equipment that may be selected to address the needs of particular processes and/or wafers.

Figure 17E:
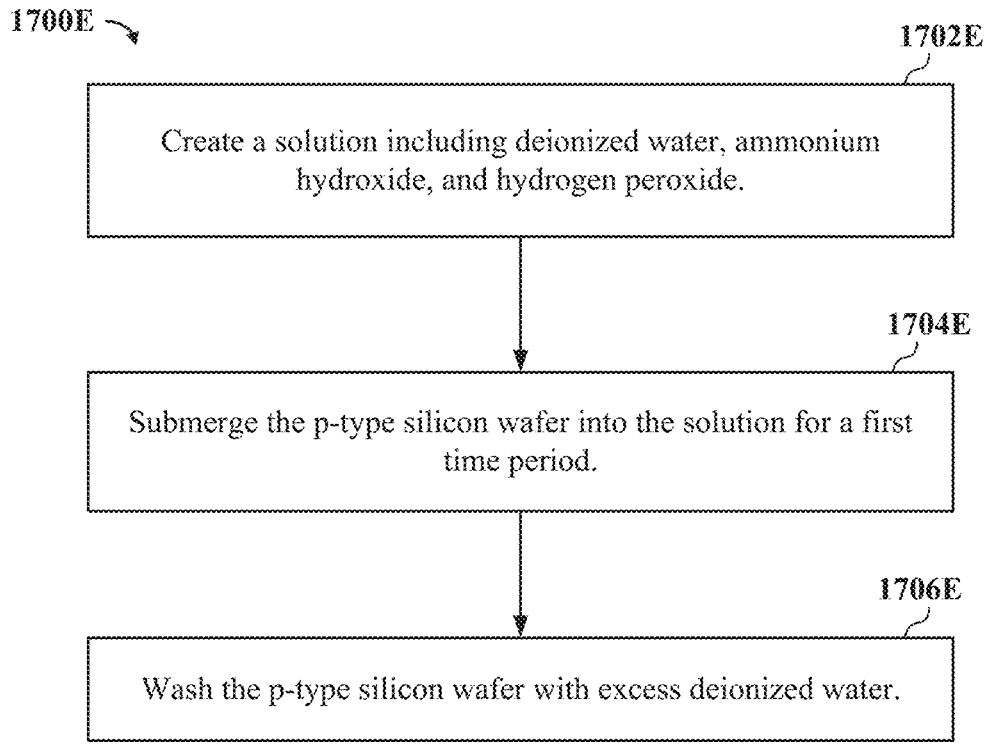

FIG. 17E shows a flowchart depicting an example operation 1700E for cleaning the p-type silicon wafer, according to some implementations. In various implementations, the operation 1700E may replace block 1704D of FIG. 17D. In some aspects, the operation 1700E begins in block 1702E with creating a solution including deionized water, ammonium hydroxide, and hydrogen peroxide. The operation 1700E continues in block 1704E with submerging the p-type silicon wafer into the solution for a first time period. The operation 1700E continues in block 1706E with washing the p-type silicon wafer with excess deionized water.

Figure 17F:
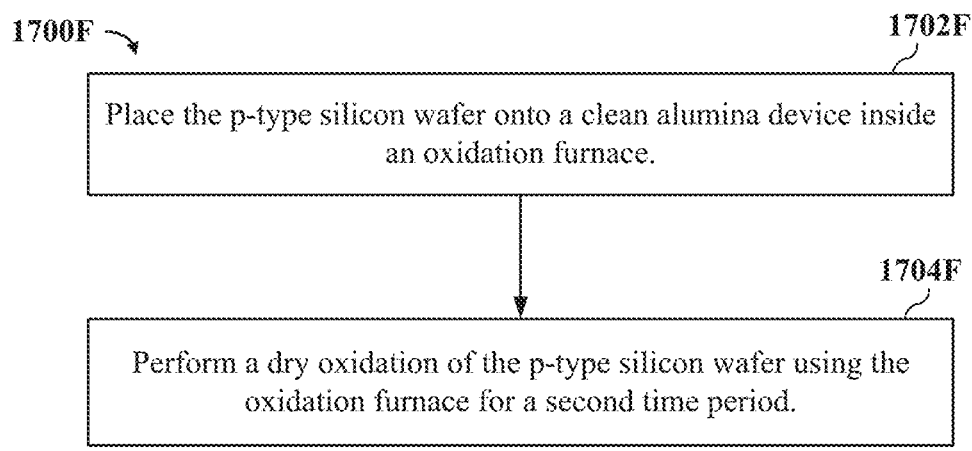

FIG. 17F shows a flowchart depicting an example operation 1700F for performing a dry oxidation of the p-type silicon wafer, according to some implementations. In various implementations, the operation 1700F may be performed after washing the p-type silicon wafer in block 1706E of FIG. 17E. In some aspects, the operation 1700F begins in block 1702F with placing the p-type silicon wafer onto a clean alumina device inside an oxidation furnace. The operation 1700F continues in block 1704F with performing a dry oxidation of the p-type silicon wafer using the oxidation furnace for a second time period.

FIG. 17G shows a flowchart depicting an example operation 1700G for preparing a thermal oxide, according to some implementations. In some aspects, the thermal oxide may be the insulating layer 110 of FIG. 1. In various implementations, the operation 1700G may be performed after the dry oxidation of the p-type silicon wafer in block 1704F of FIG. 17F. In some aspects, the operation 1700G begins in block 1702G with depositing a thermal oxide onto the p-type silicon wafer.

In various implementations, the thermal oxide in block 1702G may be prepared via microfabrication on the surface of a wafer. Microfabrication of the thermal oxide may involve forcing oxidizing agents to diffuse into the wafer at high temperature, where such oxidizing agents then chemically react with the wafer (e.g., as predicted by the Deal- Grove model). In some aspects, thermal oxidation of silicon may be performed at a temperature between 800 and 1200° C., resulting in a High Temperature Oxide layer (HTO). Thermal oxidation may use either water vapor (usually UHP steam) or molecular oxygen as the oxidant; it is consequently called either wet or dry oxidation. Thermal oxidations reactions may include one of the following:

$$Si + 2H_2O \rightarrow SiO_2 + 2H_2(g) \tag{Eq. 1}$$

$$Si + O_2 \rightarrow SiO_2 \tag{Eq. 2}$$

In some implementations, the oxidizing ambient may also contain several percent of hydrochloric acid (HCl), where the chlorine in the HCl removes metal ions that may occur in the oxide. Thermal oxide incorporates silicon consumed from the substrate (e.g., the back gate 120 of the BioFET 100 of FIG. 1) and oxygen supplied from the ambient. As a result, the thermal oxide grows both down into the wafer and up out of it. For every unit thickness of silicon consumed, approximately 2.17 unit thicknesses of oxide will appear. For example, if a bare silicon surface is oxidized, approximately 46% of the oxide thickness will lie below the original surface, and approximately 54% above it.

FIG. 17H shows a flowchart depicting an example operation 1700H for coating the p-type silicon wafer, according to some implementations. In various implementations, the operation 1700H may replace depositing the carbonaceous dispersion onto the substrate described with reference to block 1706A of FIG. 17A. In some aspects, the operation 1700H begins in block 1702H with coating the p-type silicon wafer with the carbonaceous dispersion.

In various implementations, coating materials are sprayed onto a surface. The "feedstock" (e.g., coating precursor) may heated by electrical (e.g., plasma or arc) or chemical means (e.g., a combustion flame). Thermal spraying can provide thick coatings (approx. thickness range is 20 microns to several mm, depending on the process and feedstock), over a large area at high deposition rate as compared to other coating processes such as electroplating, physical, and chemical vapor deposition. Coating materials available for thermal spraying include metals, alloys, ceramics, plastics, and composites. They are fed in powder or wire form, heated to a molten or semi molten state, and accelerated towards substrates in the form of micrometer-size particles. Combustion or electrical arc discharge is usually used as the source of energy for thermal spraying. Resulting coatings are made by the accumulation of numerous sprayed particles. The surface may not heat up significantly, allowing the coating of flammable substances. The coating quality is usually assessed by measuring its porosity, oxide content, macro and micro-hardness, bond strength and surface roughness. Generally, coating quality increases with increasing particle velocities.

FIG. 17I shows a flowchart depicting an example operation 1700I for applying a piranha solution to the p-type silicon wafer, according to some implementations. In various implementations, the operation 1700I may be performed prior to submergence of the p-type silicon wafer into the solution described with reference to block 1704E of FIG. 17E. In some aspects, the operation 1700I begins in block 1702I with applying a piranha solution including a 3:1 mixture of sulfuric acid ($H_2SO_4$) and hydrogen peroxide ($H_2O_2$) to remove any organic residue on exposed surfaces of one or more of the carbonaceous dispersion or the p-type silicon wafer. The residual piranha solution may be subsequently removed by submerging the p-type silicon wafer into the solution as described with reference to block 1704E of FIG. 17E and washing the p-type silicon wafer with excess deionized water as described with reference to block 1706E of FIG. 17E.

In various implementations, fabrication of silicon wafers (e.g., such as the back gate 120 of the BioFET 100 of FIG. 1) may be carried out with repeated etching and cleaning steps to produce micro-structures that may be necessary for final silicon semiconductor products, such as any of the BioFETs disclosed in the present disclosure. In some aspects, the disclosed piranha solution may be exothermic and prepared by adding hydrogen peroxide to sulfuric acid. The piranha solution then heats up rapidly and may be used at a temperatures of approximately 130° C. Once operating temperature and the desired concentration are reached, wet bench equipment used to provide the piranha solution to the p-type silicon wafer may need to heat the solution to maintain a uniform temperature, thereby maintaining a constant etch rate of the p-type silicon wafer.

Figure 17J:
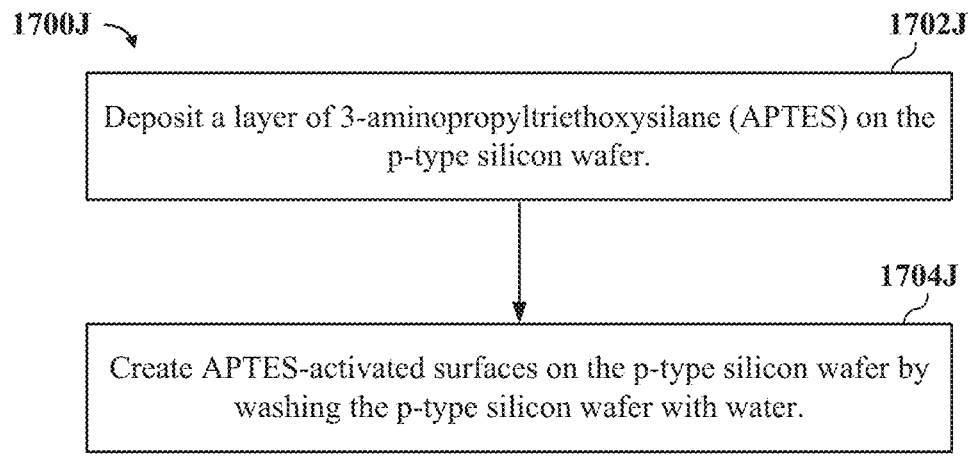

FIG. 17J shows a flowchart depicting an example operation 1700J for depositing a layer on the p-type silicon wafer, according to some implementations. In various implementations, the operation 1700J may be performed after applying the piranha solution to the p-type silicon wafer in block 1702I of FIG. 17I. In some aspects, the operation 1700J begins in block 1702J with depositing a layer of 3-aminopropyltriethoxysilane (APTES) on the p-type silicon wafer. The operation 1700J continues in block 1704J with creating APTES-activated surfaces on the p-type silicon wafer by washing the p-type silicon wafer with water to remove excess APTES.

In various implementations, APTES may be used to prepare dye-doped silica nanoparticles with minimal aggregation and minimal nonspecific binding with molecules. In some aspects, a self-assembled monolayer (SAM) of APTES can be used to improve the adhesion of graphene flakes (e.g., of the graphene layer 130 of the BioFET 100 of FIG. 1) and $SiO_2$ (e.g., of the insulating layer 110 of the BioFET 100 of Figure) to enable better contact with the source and drain regions of the BioFET.

Figure 17K:
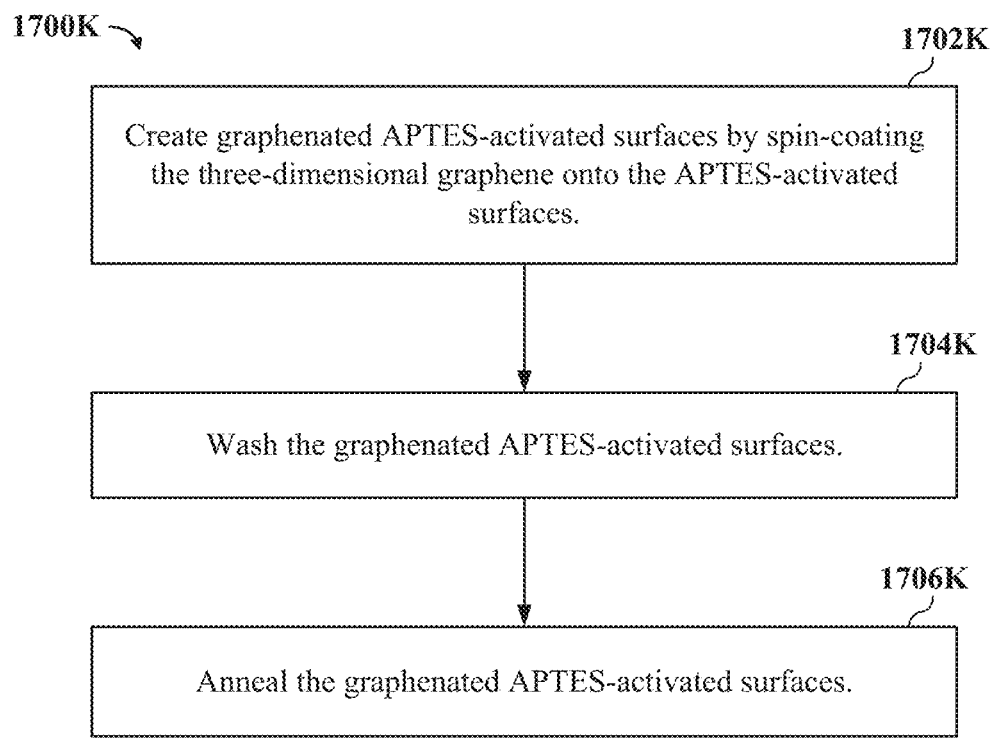

FIG. 17K shows a flowchart depicting an example operation 1700K for creating APTES-activated surfaces, according to some implementations. In various implementations, the operation 1700K may replace depositing the APTES on the p-type silicon wafer as described with reference to block 1702J of FIG. 17J. In some aspects, the operation 1700K begins in block 1702K with creating graphenated APTES-activated surfaces by spin-coating the three-dimensional graphene onto the APTES-activated surfaces. The operation 1700K continues in block 1704K with washing the graphenated APTES-activated surfaces. The operation 1700K continues in block 1706K with annealing the graphenated APTES-activated surfaces.

Figure 17L:
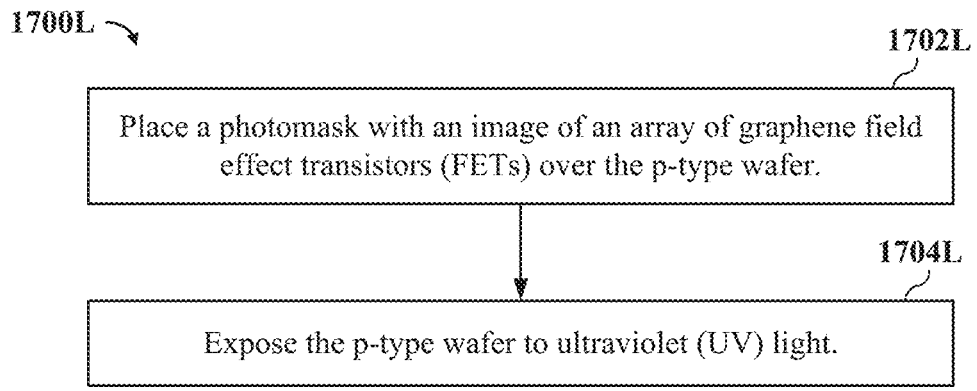

FIG. 17L shows a flowchart depicting an example operation 1700L for defining features on a BioFET, according to some implementations. In various implementations, the operation 1700L may be performed after annealing the graphenated APTES-activated surfaces in block 1706K of FIG. 17K. In some aspects, the operation 1700L begins in block 1702L with placing a photomask with an image of an array of graphene field effect transistors (FETs) over the p-type wafer. The operation 1700L continues in block 1704L with exposing the p-type wafer to ultraviolet (UV) light.

Figure 17M:
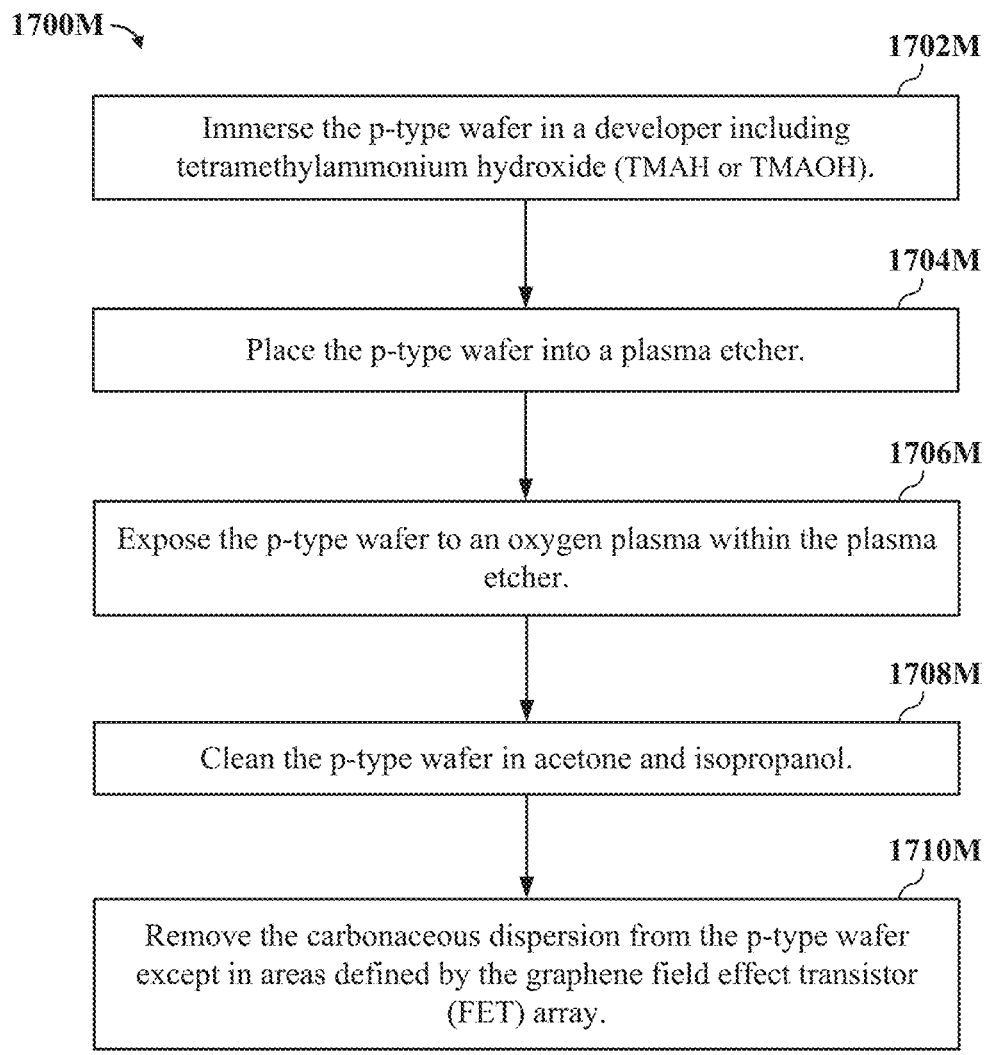

FIG. 17M shows a flowchart depicting an example operation 1700M for defining features on a BioFET, according to some implementations. In various implementations, the operation 1700M may be performed after exposing the substrate to UV light in block 1704L of FIG. 17L. In some aspects, the operation 1700M begins in block 1702M with immersing the p-type wafer in a developer including tetramethylammonium hydroxide (TMAH or TMAOH). The operation 1700M continues in block 1704M with placing the p-type wafer into a plasma etcher. The operation 1700M continues in block 1706M with exposing the p-type wafer to an oxygen plasma within the plasma etcher. The operation 1700M continues in block 1708M with cleaning the p-type wafer in acetone and isopropanol. The operation 1700M continues in block 1710M with removing the carbonaceous dispersion from the p-type wafer except in areas defined by the graphene FET array. In this way, the operation 1700M may be used to create uniquely shaped regions of the graphene layer 130 of FIG. 1 and/or the BioFETs 202 of FIG. 2.

Figure 17N:
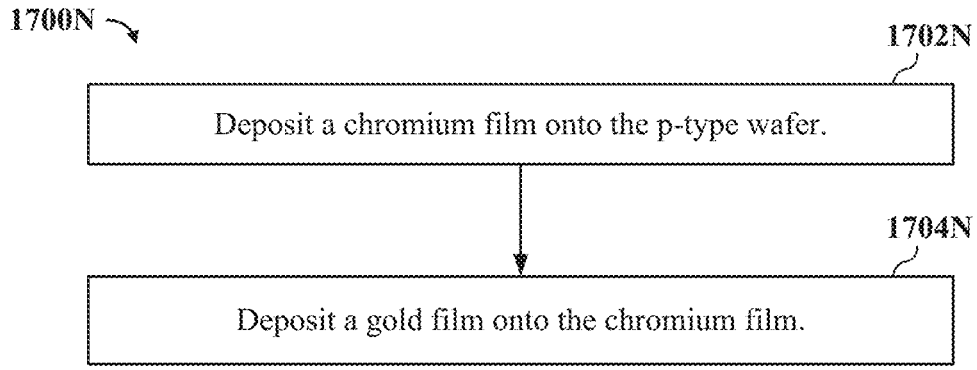

FIG. 17N shows a flowchart depicting an example operation 1700N for forming source and drain regions of a BioFET, according to some implementations. In some aspects, the source and drain regions may be the source 106 and drain 108 regions of the BioFET 100 of FIG. 1. In various implementations, the operation 1700N may be performed after forming the source and drain terminals as described with reference to block 1708A of FIG. 17A. In some aspects, the operation 1700N begins in block 1702N with depositing a chromium film onto the substrate. The operation 1700N continues in block 1704N with depositing a gold film onto the chromium film.

Figure 17O:
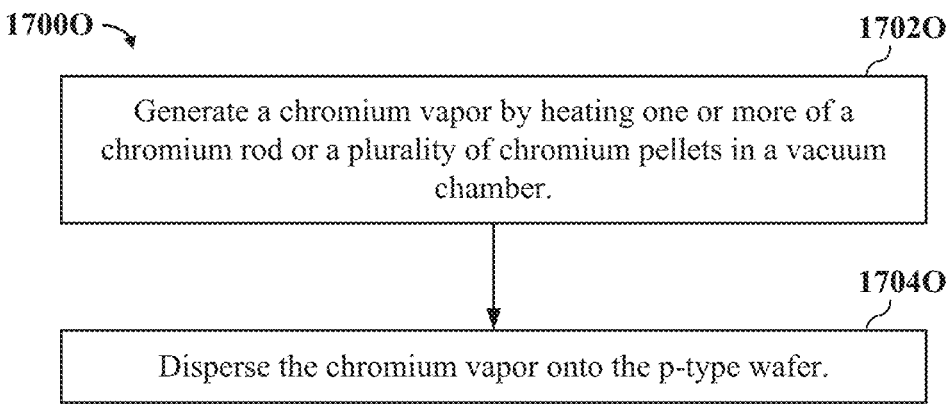

FIG. 17O shows a flowchart depicting an example operation 1700O for generating a chromium vapor, according to some implementations. In various implementations, the operation 1700O may be performed before depositing the chromium film as described with reference to block 1702N of FIG. 17N. In some aspects, the operation 1700O begins in block 1702O with generating a chromium vapor by heating one or more of a chromium rod or a plurality of chromium pellets in a vacuum chamber. The operation 1700O continues in block 1704O with dispersing the chromium vapor onto the p-type wafer.

Figure 17P:
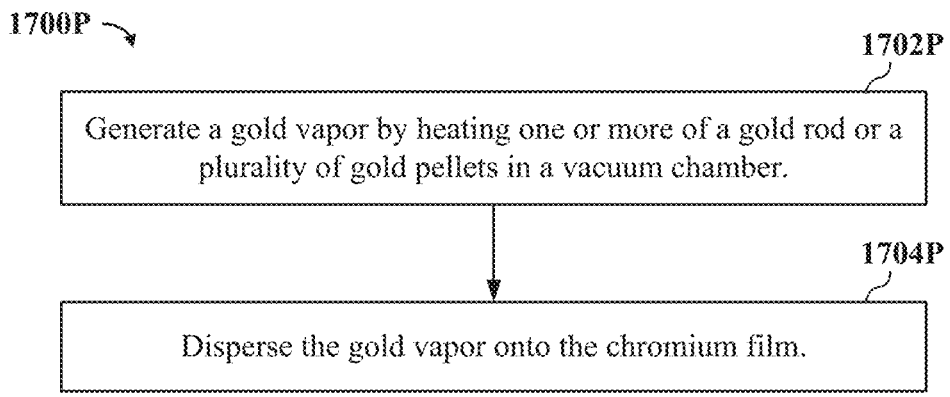

FIG. 17P shows a flowchart depicting an example operation 1700P for generating a gold vapor used in depositing a gold film onto one or more of the chromium film or the substrate, according to some implementations. In various implementations, the operation 1700P may be performed before depositing the gold film onto the chromium film. In some aspects, the operation 1700P begins in block 1702P with generating a gold vapor by heating one or more of a gold rod or a plurality of gold pellets in a vacuum chamber. The operation 1700P continues in block 1704P with dispersing the gold vapor onto the chromium film.

Figure 17Q:
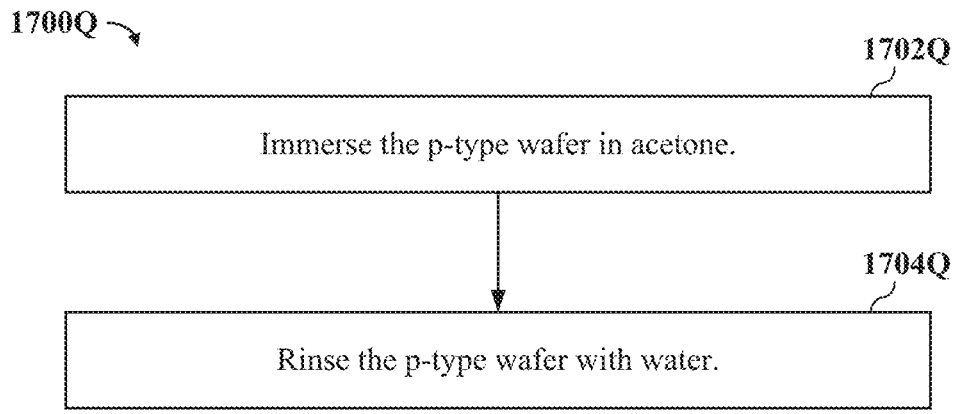

FIG. 17Q shows a flowchart depicting an example operation 1700Q for immersing the substrate in acetone, according to some implementations. In various implementations, the operation 1700Q may be performed after block 1704M of FIG. 17M. In some aspects, the operation 1700Q begins in block 1702Q with immersing the p-type wafer in acetone. The operation 1700Q continues in block 1704Q with rinsing the p-type wafer with water.

Figure 17R:
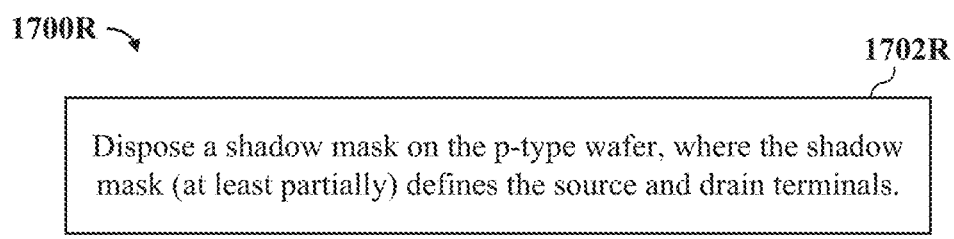

FIG. 17R shows a flowchart depicting an example operation 1700R for disposing a shadow mask on the substrate, according to some implementations. In various implementations, the operation 1700R may be performed after placing the photomask over the substrate as described with reference to block 1702L of FIG. 17L. In some aspects, the operation 1700R begins in block 1702R with disposing the shadow mask on the p-type wafer. The shadow mask may (at least partially) define the source region 106 and/or the drain region 108 of the BioFET 100 of FIG. 1.

In various implementations, the photomask is an opaque plate with holes or transparencies that allow light to shine through in a defined pattern. Photomasks may be used in photolithography and the production of integrated circuits (ICs or "chips") in particular. Photomasks may be used to produce a pattern on a substrate, such as a slice of silicon, e.g., a wafer in the case of chip manufacturing. In some aspects, several photomasks may be used sequentially, with each photomask reproducing a layer of the completed design. In this way, photomasks collectively may be referred to as "a mask set." In contrast, a shadow mask is a metal plate punched with holes that may separate the colored phosphors in the layer behind the front glass of the screen. Shadow masks are made by photochemical machining, a technique that allows for the drilling of small holes on metal sheets.

Figure 17S:
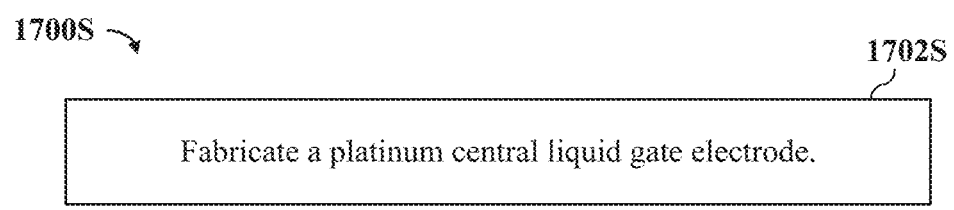

FIG. 17S shows a flowchart depicting an example operation 1700S for fabricating a gate electrode, according to some implementations. In some aspects, the gate electrode may be the gate electrode 150 of FIG. 1. In various implementations, the operation 1700S may be performed concurrently with the preparation of the carbonaceous dispersion as described with reference to block 1702A of FIG. 17A. In some aspects, the operation 1700S begins in block 1702S with fabricating a platinum central liquid gate electrode.

In various implementations, the platinum central liquid gate electrode may be positioned on top of the insulating layer 110 of the BioFET 100 of FIG. 1, and thereafter may be used to control current flow through the graphene layer 130 of the BioFET 100 of FIG. 1. In some aspects, the platinum central liquid gate electrode may be made of doped polycrystalline silicon (e.g., designated as "poly"), which may serve as an electrical conductor and can be patterned into narrow lines. In one implementation, the BioFET 100 may have a physical gate length of the gate electrode 150 of approximately 50 nanometers (nm).

Figure 17T:
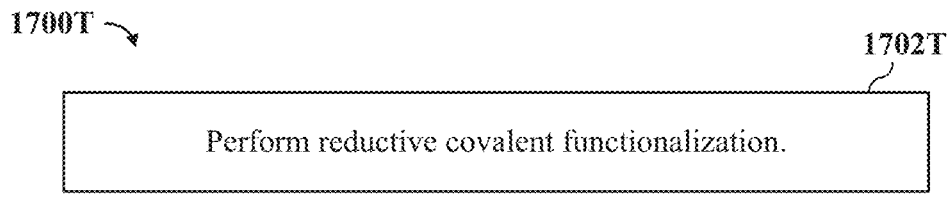

FIG. 17T shows a flowchart depicting an example operation 1700T for performing functionalization, according to some implementations. In various implementations, the operation 1700T may replace or be performed concurrently with biofunctionalizing the carbonaceous dispersion on the p-type silicon wafer as described with reference to block 1714A. In some aspects, the operation 1700T begins in block 1702T with performing reductive covalent functionalization on exposed surfaces of the carbonaceous dispersion.

In various implementations, graphene functionalization may be used to controllably engineer a band gap structure of the BioFET 100 of FIG. 1, to create novel architectures, and to manipulate the interfacial characteristics of mono-layer graphene and/or multi-layer graphene (such as the graphene layer 130 of FIG. 1). Covalent functionalization may be performed through several chemical reactions and have been used in solid supports and in homogeneous dispersions (e.g., diazo coupling, iodonium coupling, alkylation, cycloadditions, Diels-Alder reactions, addition of phenyl radicals, hydrogenation, halogenation, and silylation. Among different synthetic approaches, the reduction of graphite using alkaline metals in suitable solvents yielding graphite intercalation compounds (GICs), followed by the quenching of the intermediately generated graphenides with electrophiles, provides an efficient route.

FIG. 17U shows a flowchart depicting an example operation 1700U for stacking molecules, according to some implementations. In various implementations, the operation 1700U may replace or be performed concurrently with biofunctionalizing the carbonaceous dispersion on the p-type silicon wafer as described with reference to block 1714A. In some aspects, the operation 1700U begins in block 1702U with stacking molecules on exposed surfaces of the 3D graphene layer 130 of FIG. 1.

FIG. 17V shows a flowchart depicting an example operation 1700V for yielding carboxylic acids, according to some implementations. In various implementations, the operation 1700V may be performed concurrently with biofunctionalizing the carbonaceous dispersion on the p-type silicon wafer as described with reference to block 1714A. In some aspects, the operation 1700V begins in block 1702V with yielding carboxylic acids on exposed surfaces of the carbonaceous dispersion. The operation 1700V continues at block 1704V with reacting the carboxylic acids with amines from bioreceptors in the carbonaceous dispersion using EDC (1-ethyl-3-(3-dimethylaminopropyl)carbodiimide hydrochloride) and sulfo-NHS (N-hydroxysulfosuccinimide).

As used herein, a phrase referring to "at least one of" or "one or more of" a list of items refers to any combination of those items, including single members. For example, "at least one of: a, b, or c" is intended to cover the possibilities of: a only, b only, c only, a combination of a and b, a combination of a and c, a combination of b and c, and a combination of a and b and c.

The various illustrative components, logic, logical blocks, modules, circuits, operations, and algorithm processes described in connection with the implementations disclosed herein may be implemented as electronic hardware, firmware, software, or combinations of hardware, firmware, or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

Various modifications to the implementations described in this disclosure may be readily apparent to persons having ordinary skill in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

What is claimed is:

1. A method of fabricating a biological field-effect transistor (BioFET), the method comprising:
    preparing a carbonaceous dispersion by adding a three-dimensional (3D) graphene into a solvent;
    depositing the carbonaceous dispersion onto a p-type silicon wafer;
    spin-coating a positive photoresist over the carbonaceous dispersion by placing a photomask with an image of an array of graphene field effect transistors (FETs) over the p-type wafer and exposing the p-type wafer to ultraviolet (UV) light;
    forming source and drain terminals on the p-type silicon wafer, the source and drain terminals in contact with the 3D graphene of the carbonaceous dispersion;
    removing residual photoresist from the carbonaceous dispersion by placing the p-type silicon wafer in 1-methyl-2-pyrrolidone (NMP); and
    biofunctionalizing the carbonaceous dispersion with a molecular recognition element configured to alter one or more electrical properties of the Bio-FET in response to exposure of the molecular recognition element to the analyte.

2. The method of claim 1, wherein preparing the carbonaceous dispersion further comprises:
    sonicating the carbonaceous dispersion for a defines time period.

3. The method of claim 1, wherein preparing the carbonaceous dispersion further comprises:
    discarding precipitates from the carbonaceous dispersion; and
    retaining the 3D graphene in the solvent.

4. The method of claim 1, further comprising:
    cleaning the p-type silicon wafer by removing organic contaminants, oxide layers, and ionic contamination.

5. The method of claim 4, further comprising:
    creating a solution including deionized water, ammonium hydroxide, and hydrogen peroxide;
    submerging the p-type silicon wafer into the solution for a first time period; and
    washing the p-type silicon wafer with excess deionized water.

6. The method of claim 5, further comprising:
    placing the p-type silicon wafer onto a clean alumina device inside an oxidation furnace; and
    performing a dry oxidation of the p-type silicon wafer using the oxidation furnace for a second time period.

7. The method of claim 1, wherein obtaining the substrate further comprises:
    depositing a thermal oxide onto the p-type silicon wafer.

8. The method of claim 7, further comprising:
    coating the p-type silicon wafer with the carbonaceous dispersion.

9. The method of claim 8, further comprising:
applying a piranha solution including a 3:1 mixture of sulfuric acid ($H_2SO_4$) and hydrogen peroxide ($H_2O_2$) to remove any organic residue on exposed surfaces of the carbonaceous dispersion or the p-type silicon wafer.

10. The method of claim 9, further comprising:
depositing a layer of 3-aminopropyltriethoxysilane (APTES) on the p-type silicon wafer; and
creating a plurality of APTES-activated surfaces on the p-type silicon wafer by removing excess APTES with water.

11. The method of claim 10, further comprising:
creating a plurality of graphenated APTES-activated surfaces by spin-coating the three-dimensional graphene onto the plurality of APTES-activated surfaces;
washing the plurality of graphenated APTES-activated surfaces; and
annealing the plurality of graphenated APTES-activated surfaces.

12. The method of claim 1, further comprising:
immersing the p-type wafer in a developer including tetramethylammonium hydroxide;
placing the p-type wafer into a plasma etcher;
exposing the p-type wafer to an oxygen plasma within the plasma etcher;
cleaning the p-type wafer in acetone and isopropanol; and
removing the carbonaceous dispersion from the p-type wafer except in areas defined by the array of graphene FET.

13. The method of claim 1, wherein forming the source and drain terminals further comprises placing a photomask over the p-type wafer.

14. The method of claim 13, further comprising:
depositing a chromium film onto the p-type wafer; and
depositing a gold film onto the chromium film.

15. The method of claim 14, wherein depositing the chromium film further comprises:
generating a chromium vapor by heating one or more of a chromium rod or a plurality of chromium pellets in a vacuum chamber; and
dispersing the chromium vapor onto the p-type wafer.

16. The method of claim 14, wherein depositing the gold film further comprises:
generating a gold vapor by heating one or more of a gold rod or a plurality of gold pellets in a vacuum chamber; and
dispersing the gold vapor onto the chromium film.

17. The method of claim 14, further comprising:
immersing the p-type wafer in acetone; and
rinsing the p-type wafer with water.

18. The method of claim 14, further comprising disposing a shadow mask on the p-type wafer, wherein the shadow mask at least partially defines the source drain terminals.

19. The method of claim 1, further comprising:
fabricating a platinum central liquid gate electrode.

20. The method of claim 1, wherein biofunctionalizing the carbonaceous dispersion further comprises:
performing reductive covalent functionalization.

21. The method of claim 1, wherein biofunctionalizing the carbonaceous dispersion further comprises:
stacking biomolecules on exposed surfaces of the 3D graphene.

22. The method of claim 17, wherein performing reductive covalent functionalization further comprises:
yielding carboxylic acids on exposed surfaces of the carbonaceous dispersion; and reacting carboxylic acids with amines from bioreceptors in the carbonaceous dispersion using EDC (1-ethyl-3-(3-dimethylaminopropyl)carbodiimide hydrochloride) and sulfo-NHS (N-hydroxysulfosuccinimide).

* * * * *